US011682467B2

(12) United States Patent
Kim et al.

(10) Patent No.: US 11,682,467 B2
(45) Date of Patent: Jun. 20, 2023

(54) NONVOLATILE MEMORY DEVICE, CONTROLLER FOR CONTROLLING THE SAME, STORAGE DEVICE INCLUDING THE SAME, AND READING METHOD OF THE SAME

(71) Applicant: Samsung Electronics Co., Ltd., Suwon-si (KR)

(72) Inventors: Jinyoung Kim, Seoul (KR); Sehwan Park, Yongin-si (KR); Youngdeok Seo, Seoul (KR); Ilhan Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 38 days.

(21) Appl. No.: 17/353,583

(22) Filed: Jun. 21, 2021

(65) Prior Publication Data

US 2022/0139484 A1     May 5, 2022

(30) Foreign Application Priority Data

Nov. 4, 2020    (KR) ........................ 10-2020-0145658

(51) Int. Cl.
| | |
|---|---|
| G11C 16/26 | (2006.01) |
| G11C 29/42 | (2006.01) |
| G11C 16/04 | (2006.01) |
| G11C 16/08 | (2006.01) |
| G11C 16/24 | (2006.01) |

(Continued)

(52) U.S. Cl.
CPC .......... *G11C 29/42* (2013.01); *G11C 16/0433* (2013.01); *G11C 16/08* (2013.01); *G11C 16/24* (2013.01); *G11C 16/26* (2013.01); *G11C 16/3495* (2013.01); *G11C 29/4401* (2013.01)

(58) Field of Classification Search
CPC ..... G11C 29/42; G11C 16/0433; G11C 16/08; G11C 16/24; G11C 16/26; G11C 16/3495; G11C 29/4401; G11C 16/349; G11C 11/5642; G11C 16/28; G11C 29/028; G11C 29/50004; G11C 29/021
See application file for complete search history.

(56) References Cited

U.S. PATENT DOCUMENTS

| | | | |
|---|---|---|---|
| 7,679,133 | B2 | 3/2010 | Son et al. |
| 7,859,932 | B2 | 12/2010 | Mokhlesi |
| 3,072,805 | A1 | 12/2011 | Chou et al. |

(Continued)

OTHER PUBLICATIONS

Office Action dated Jul. 7, 2022 issued in relation to the corresponding Chinese Patent Application No. 201910910612.7 together with a machine English translation thereof.

*Primary Examiner* — Jay W. Radke
(74) *Attorney, Agent, or Firm* — Muir Patent Law, PLLC

(57) ABSTRACT

A nonvolatile memory device includes a plurality of memory blocks and a control logic circuit configured to perform a first page on-chip valley search (OVS) operation on memory cells connected to one wordline of a memory block selected in response to an address, among the plurality of memory blocks, in response to a first read command. The control logic circuit is further configured to change a read level of at least one state using detection information of the first page OVS operation, and to perform a second page read operation on the memory cells using the changed read level in response to a second read command.

20 Claims, 27 Drawing Sheets

(51) Int. Cl.
    *G11C 16/34*     (2006.01)
    *G11C 29/44*     (2006.01)

(56) References Cited

U.S. PATENT DOCUMENTS

| | | | |
|---|---|---|---|
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,472,298 B1 | 10/2016 | Louie et al. | |
| 9,536,970 B2 | 1/2017 | Seol et al. | |
| 9,836,219 B2 | 12/2017 | Kim et al. | |
| 10,090,046 B2 | 10/2018 | Park et al. | |
| 10,120,589 B2 * | 11/2018 | Jung | G06F 12/0246 |
| 10,163,518 B2 | 12/2018 | Yoon et al. | |
| 10,373,693 B2 | 8/2019 | Cha et al. | |
| 10,529,432 B2 | 1/2020 | Park | |
| 10,559,362 B2 | 2/2020 | Shin et al. | |
| 10,607,708 B2 | 3/2020 | Oh et al. | |
| 10,629,259 B2 | 4/2020 | Jang | |
| 2016/0239235 A1 * | 8/2016 | Chung | G11C 7/04 |
| 2018/0102790 A1 * | 4/2018 | Oh | G11C 29/52 |
| 2019/0362794 A1 * | 11/2019 | Oh | G11C 16/26 |
| 2020/0098436 A1 * | 3/2020 | Kim | G06F 11/1048 |
| 2020/0111529 A1 * | 4/2020 | Shin | G11C 16/28 |
| 2020/0126621 A1 | 4/2020 | Park et al. | |
| 2020/0152276 A1 | 5/2020 | Shin et al. | |
| 2020/0176045 A1 | 6/2020 | Jung | |
| 2020/0211656 A1 | 7/2020 | Oh et al. | |
| 2020/0286545 A1 | 9/2020 | Yoon | |
| 2021/0005268 A1 * | 1/2021 | Kim | G11C 11/5671 |
| 2022/0005539 A1 | 1/2022 | Kim et al. | |
| 2022/0130437 A1 * | 4/2022 | Park | G11C 7/1084 |
| 2022/0139483 A1 * | 5/2022 | Park | G11C 16/0433 |
| | | | 365/185.09 |
| 2022/0139484 A1 * | 5/2022 | Kim | G11C 16/28 |
| | | | 365/185.09 |

* cited by examiner

|  |  | OVS Detection Case | | | | |
|---|---|---|---|---|---|---|
|  |  | C1 | C2 | C3 | C4 | C5 |
| State | R1 | −40 mV | −32 mV | 0 mV | 32 mV | 40 mV |
|  | R2 | −30 mV | −24 mV | 0 mV | 24 mV | 30 mV |
|  | R3 | −20 mV | −16 mV | 0 mV | 16 mV | 20 mV |
|  | R4 | −40 mV | −32 mV | 0 mV | 32 mV | 40 mV |
|  | R5 | −60 mV | −48 mV | 0 mV | 48 mV | 60 mV |
|  | R6 | −80 mV | −64 mV | 0 mV | 64 mV | 80 mV |
|  | R7 | −100 mV | −80 mV | 0 mV | 80 mV | 100 mV |

FIG. 10C

|  | R1 | R2 | R3 | R4 | R5 | R6 | R7 |
|---|---|---|---|---|---|---|---|
| Level Offset | −32 mV | −24 mV | −16 mV | −32 mV | −48 mV | −64 mV | −80 mV |

FIG. 10D

|  |  | OVS Detection Case | | | | |
|---|---|---|---|---|---|---|
|  |  | C1 | C2 | C3 | C4 | C5 |
| State | R1 | −40 mV | −32 mV | 0 mV | 32 mV | 40 mV |
|  | R2 | −30 mV | −24 mV | 0 mV | 24 mV | 30 mV |
|  | R3 | −20 mV | −16 mV | 0 mV | 16 mV | 20 mV |
|  | R4 | −40 mV | −32 mV | 0 mV | 32 mV | 40 mV |
|  | R5 | −60 mV | −48 mV | 0 mV | 48 mV | 60 mV |
|  | R6 | −80 mV | −64 mV | 0 mV | 64 mV | 80 mV |
|  | R7 | −100 mV | −80 mV | 0 mV | 80 mV | 100 mV |

FIG. 12A

|  | R1 | R2 | R3 | R4 | R5 | R6 | R7 |
|---|---|---|---|---|---|---|---|
| Level Offset | −32 mV | −24 mV | −16 mV | −32 mV | −48 mV | −64 mV | −80 mV |

FIG. 12B

| Read Sequence | | | | | | | |
|---|---|---|---|---|---|---|---|
| Page | LSB | | CSB | | | MSB | |
| Read level | R1 | R5 | R2 | R4 | R6 | R3 | R7 |
| Page Read Sequence | 1 | 2 | 1 | 2 | 3 | 2 | 1 |
| | | | 3 | 2 | 1 | | |

NONVOLATILE MEMORY DEVICE, CONTROLLER FOR CONTROLLING THE SAME, STORAGE DEVICE INCLUDING THE SAME, AND READING METHOD OF THE SAME

CROSS-REFERENCE TO RELATED APPLICATION(S)

This application claims benefit of priority under 35 U.S.C. § 119 to Korean Patent Application No. 10-2020-0145658, filed on Nov. 4, 2020, in the Korean Intellectual Property Office, the disclosure of which is incorporated herein by reference in its entirety.

BACKGROUND

The present disclosure relates to a nonvolatile memory device, a controller for controlling the same, a storage device including the same, and a reading method of the same.

In general, a storage device generates an error correction code using an error correction code (ECC) circuit in a write operation, and corrects an error in data, based on the error correction code, in a read operation. However, there may be a case in which the degree of degradation of memory cells of a storage device is so severe that an error cannot be corrected using an ECC circuit. In such a case, a read retry operation is performed using a sensing scheme different from a sensing scheme of a normal read operation.

SUMMARY

Example embodiments provide a nonvolatile memory device reducing entry into a lifetime recovery code, a controller including the nonvolatile memory device, and a reading method of the nonvolatile memory device.

According to an example embodiment, a reading method of a nonvolatile memory device includes: receiving a first read command for reading first page data, corresponding to a wordline, from a controller; performing a first page on-chip valley search (OVS) operation in response to the first read command; outputting the first page data based on the first page OVS operation to the controller; outputting detection information, indicating detection cases for at least two states of the first page OVS operation, to the controller in response to a specific command from the controller; receiving a second read command for reading second page data, corresponding to the wordline, from the controller; performing a second page read operation in response to the second read command; and outputting the second page data, based on the second page read operation, to the controller. A read level of at least one state, different from the at least two states, is changed using the detection information, and the second page read operation is performed based on the changed read level.

According to an example embodiment, a nonvolatile memory device includes: a plurality of memory blocks including at least two strings between respective bitlines and a common source line, wherein each of the at least two strings includes at least one string select transistor, a plurality of memory cells, and at least one ground transistor connected between one of the bitlines and the common source line in series, the at least one string select transistor has a gate connected to a string select line, each of the plurality of memory cells is provided with a wordline voltage from a corresponding wordline, and the at least one ground transistor has a gate connected to a ground select line; and a control logic circuit configured to perform a first page on-chip valley search (OVS) operation on memory cells connected to one of the plurality of memory blocks in response to an address during a read operation, to change a read level of at least one state using detection information of the first page OVS operation during the read operation, and to perform a second page read operation on the memory cells using the changed read level in response to a second read command during the read operation.

According to an example embodiment, a controller includes: control pins configured to provide control signals to at least one nonvolatile memory device; a buffer memory configured to store a first table, a second table, and a third table; an error correction circuit configured to correct an error in first page data read from the at least one nonvolatile memory device according to a first read command, or to correct an error in second page data read from the at least one nonvolatile memory device according to a second read command; and a processor configured to drive a read level compensation unit configured to manage a read level of a read operation of the at least one nonvolatile memory device. The first table includes a first offset predetermined based on environmental information, the second table includes a second offset according to a state-dependent detection case in an on-chip valley search (OVS) operation, and the third table includes a third offset generated using the first offset or the second offset. The read level compensation unit updates the third offset of at least one read level to be used in a second page read operation according to the second read command using detection information of a first page OVS operation according to the first read command and the second table.

According to an example embodiment, a storage device includes: at least one nonvolatile memory device; and a controller connected to the at least one nonvolatile memory device by control pins configured to provide a command latch enable (CLE) signal, an address latch enable (ALE) signal, a chip enable (CE) signal, a write enable (WE) signal, a read enable (RE) signal, and a DQS signal, and configured to read data from the at least one nonvolatile memory device. The at least one nonvolatile memory device latches a read command on an edge of the WE signal according to the CLE signal and the ALE signal to perform a first page on-chip valley search (OVS) operation or a second page read operation. The controller receives detection information according to the first page OVS operation from the at least one nonvolatile memory device in response to a specific command, and changes at least one read level of the second page read operation using the detection information.

According to an example embodiment, a nonvolatile memory device includes: a memory cell region having a first metal pad; a peripheral circuit region having a second metal pad and vertically connected to the first metal pad through the second metal pad; a memory cell array including a plurality of memory blocks, each having a plurality of memory cells connected to a plurality of wordlines and a plurality of bitlines, in the memory cell region; a row decoder configured to select one of the plurality of wordlines in the peripheral circuit region; a page buffer circuit having a plurality of page buffers, connected to the plurality of bitlines, in the peripheral circuit region; and a control logic circuit configured to receive a command latch enable (CLE) signal, an address latch enable (ALE) signal, a chip enable (CE) signal, a write enable (WE) signal, a read enable (RE) signal, and a DQS signal and to latch a command or an address on an edge of the WE signal according to the ALE signal to perform a first page on-chip valley search (OVS) operation or a second page read operation, in the peripheral circuit region. The second page read operation is performed using a read level changed using detection information of the first page OVS operation.

BRIEF DESCRIPTION OF DRAWINGS

The above and other aspects, features, and advantages of the present disclosure will be more clearly understood from the following detailed description, taken in conjunction with the accompanying drawings.

FIGS. 10A, 10B, 10C, and 10D are conceptual diagrams of a reading method of a storage device according to an example embodiment.

FIGS. 12A and 12B are views illustrating an example of HRT update when degradation directions are the same and different detection cases are indicated.

DETAILED DESCRIPTION

Hereinafter, example embodiments will be described with reference to the accompanying drawings.

A threshold voltage distribution of a programmed memory cell may be modified by one or more causes (retention, disturbance, temperature, noise, and the like). Such a modified threshold voltage distribution may result in an error (for example, error uncorrectable) in a read operation. The recovery code refers to a scheme to recover an error in data read in a read operation. In general, the recovery code may include an operation of searching a modified threshold voltage distribution valley. An on-chip valley search (hereinafter referred to as "OVS") operation may be advantageous for searching such a distribution valley. Detailed descriptions of the OVS operation are provided in U.S. Patent Application Publication No. 2020-0286545, U.S. Patent Application Publication No. 2020-0098436, U.S. Pat. Nos. 10,090,046, 10,559,362, 10,607,708, and 10,629,259, the disclosures of which are incorporated herein by reference.

In general, there is a high probability that pages, connected to the same wordline in an OVS recovery code, are each degraded in similar directions. In a nonvolatile memory device according to example embodiments, a controller for controlling the same, a storage device including the same, and a reading method of the same, a history read level table (HRT) is not updated by searching an OVS table whenever an error has occurred in each state. Instead, a direction searched during a read operation of a first page (for example, a most significant bit page or a least significant bit page) may be reflected in advance on correction of another state valley of the other pages connected to the same wordline to reduce probability of error occurrence.

Figure 1:
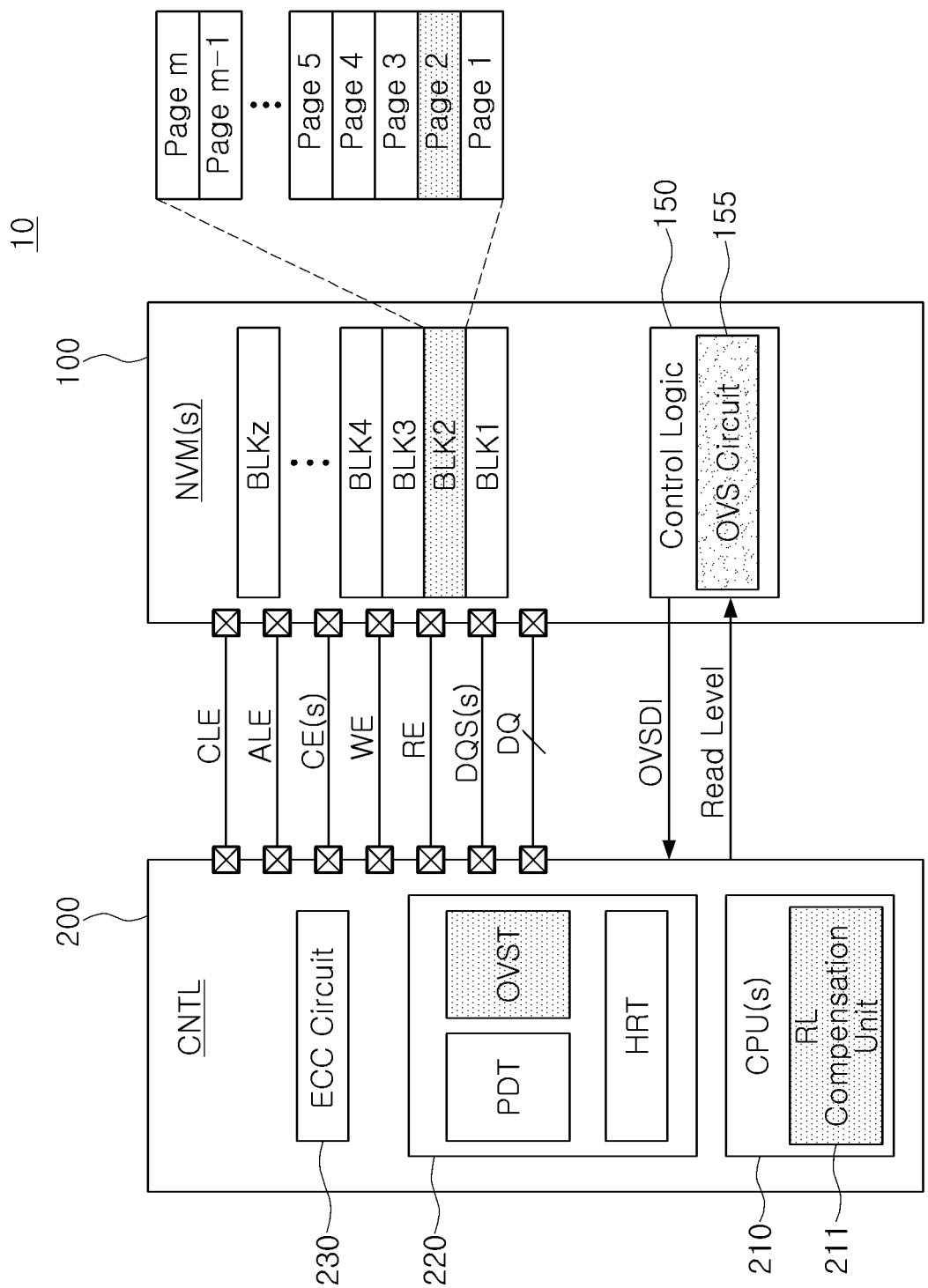
FIG. 1 is a view illustrating a storage device according to an example embodiment.

FIG. 1 is a view illustrating a storage device 10 according to an example embodiment. Referring to FIG. 1, the storage device 10 may include at least one nonvolatile memory device (NVM(s)) 100 and a controller (CNTL) 200.

The at least one nonvolatile memory device 100 may be configured to store data. The nonvolatile memory device 100 may be a NAND flash memory, a vertical NAND flash memory, a NOR flash memory, a resistive random access memory (RRAM), and a phase-change memory (PRAM), a magneto-resistive random access memory (MRAM), a ferroelectric random access memory (FRAM), a spin transfer torque random access memory (STT-RAM), or the like. The nonvolatile memory device 100 may be implemented in a three-dimensional array structure. The present disclosure may be applied to a flash memory device, in which a charge storage layer is formed as a conductive floating gate, as well as a charge trap flash (CTF) memory in which a charge storage layer is formed as an insulating layer. Hereinafter, for ease of description, a description will be provided as to the case in which the nonvolatile memory device 100 is a vertical NAND flash memory device (VNAND).

The nonvolatile memory device 100 may be implemented to include a plurality of memory blocks BLK1 to BLKz (where z is an integer greater than or equal 2) and a control logic circuit 150.

Each of the plurality of memory blocks BLK1 to BLKz may include a plurality of pages Page 1 to Page m (m is an integer greater than or equal to 2). Each of the plurality of pages Page 1 to Page m may include a plurality of memory cells. Each of the plurality of memory cells may store at least one bit.

The control logic circuit 150 may receive a command and an address from the controller (CNTL) 200, and may perform operations (a program operation, a read operation, an erase operation, and the like), corresponding to the received command, on memory cells corresponding to the received address.

The control logic circuit 150 may include an on-chip valley search (OVS) circuit 155. The OVS circuit 155 may be configured to perform an OVS operation. In general, the OVS operation may include an operation of obtaining a cell count according to various development times corresponding to detection cases, an operation of determining an OVS detection case based on the obtained cell count, and a main sensing operation of changing and sensing an actual development time according to the determined OVS detection case. The OVS circuit 155 may be configured to store detection information (detection case information) OVSDI corresponding to the result of the OVS operation. This detection information (OVSDI) may include information (for example, development time information) indicating an optimal distribution valley corresponding to a state.

The controller (CNTL) 200 may be connected to the at least one nonvolatile memory device 100 through a plurality of control pins for transmitting control signals (for example, CLE, ALE, CE(s), WE, RE, and the like). In addition, the controller (CNTL) 200 may be configured to control the nonvolatile memory device 100 using the control signals (CLE, ALE, CE(s), WE, RE, and the like). For example, the nonvolatile memory device 100 may latch a command CMD or an address ADD on an edge of a write enable signal WE according to a command latch enable signal CLE and an address latch enable signal ALE to perform program, read, and erase operations.

In addition, the controller 200 may include at least one processor (CPU(s)) 210, a buffer memory 220, and an error correction circuit 230.

The processor 210 may be configured to control all operations of the storage device 10. The processor 210 may perform management operations such as cache/buffer management, firmware management, garbage collection management, wear-leveling management, data deduplication management, read refresh/reclaim management, bad block management, multi-stream management, mapping management of host data and nonvolatile memory, quality of service (QoS) management, system resource allocation management, nonvolatile memory queue management, read level management, erase/program management, hot/cold data management, power loss protection management, dynamic thermal management, initialization management, redundant array of inexpensive disk (RAID) management, and the like.

In particular, the processor 210 may drive the read level compensation unit 211 managing a read level. In an example embodiment, the read level compensation unit 211 may reflect detection information (offset information) OVSDI, corresponding to a result obtained by performing the OVS operation, on a history read level. For example, the read level compensation unit 211 may reflect an offset corresponding to the detection information (OVSDI) to a History Read Level Table (HRT) using an OVS Table (OVST). In an example embodiment, the read level compensation unit 211 may use detection information (OVSDI) of a first OVS operation for at least two states to determine a history read level offset for at least one of the other states.

In an example embodiment, the read level compensation unit 211 may be implemented in firmware/software. The read level compensation unit 211, illustrated in FIG. 1, may be implemented inside the controller 200. However, the present disclosure is not be limited thereto, and the read level compensation unit 211 may be implemented inside the nonvolatile memory device 100.

The buffer memory 220 may be implemented as a volatile memory (for example, a static random access memory (SRAM), a dynamic RAM (DRAM), a synchronous DRAM (SDRAM), or the like), or a nonvolatile memory (a flash memory, a phase-change RAM (PRAM), a magneto-resistive RAM (MRAM), a resistive RAM (ReRAM), a ferroelectric RAM (FRAM), or the like). The buffer memory 220 may include at least one pre-defined table (PDT), at least one OVS table (OVST), and at least one history read level table (HRT).

The PDT may include first read level offset information. In an example embodiment, the PDT may include first read level offset information corresponding to an elapsed program time. In an example embodiment, the PDT may include first read level offset information corresponding to various degradation information (temperature, program/erase cycle, read cycle, open wordline case, wordline location information, and the like), other than the program elapsed time.

The OVST may include second read level offset information corresponding to detection information (OVSDI). The detection information (OVSDI) may be development time information corresponding to an optimal distribution valley. For example, the second read level offset information may include read level offset information corresponding to development time information on which an OVS operation is performed. Accordingly, the OVST may be a table obtained by converting the detection information (OVSDI) into read level offset information.

The HRT may include third read level offset information associated with a history read operation. In an example embodiment, the third read level offset information may include information obtained by accumulating the second read level offset information. In another embodiment, the third read level offset information may be determined using the first read level offset information and the second read level offset information. The third read level offset information may include an optimal read level for performing a history read operation. Detailed descriptions of the history read operation are provided in U.S. Pat. Nos. 10,120,589 and 10,373,693, the disclosures of which are incorporated herein by reference.

The ECC circuit 230 may be configured to generate an error correction code (ECC) during a program operation and to recover data using an error correction code during a read operation. For example, the ECC circuit 230 may generate an error correction code (ECC) for correcting a failure bit or an error bit of data DATA received from the nonvolatile memory device 100. The ECC circuit 230 may perform error correction encoding on data, provided to the nonvolatile memory device 100, to generate data to which a parity bit is added. The parity bit may be stored in the nonvolatile memory device 100. In addition, the ECC circuit 230 may perform error correction decoding on data output from the nonvolatile memory device 100. The ECC circuit 230 may correct an error using a parity. The ECC circuit 230 may correct an error using coded modulation such as a low density parity check (LDPC) code, a BCH code, a turbo code, a Reed-Solomon code, a convolution code, a recursive systematic code (RSC), trellis-coded modulation (TCM), block coded modulation (BCM), or the like.

When an error correction is uncorrectable by the error correction circuit 230, a read retry operation may be performed. In an example embodiment, the read retry operation may include an OVS operation. In another embodiment, the read retry operation may include a PDT-reflected OVS operation.

The storage device 10 according to an example embodiment may not perform an OVS operation before an uncorrectable error correction code (UECC) is generated, and may activate an OVS operation only after the UECC has occurred. In addition, the storage device 10 may reflect detection information (OVSDI) in advance on a history read level table (HRT) as an offset for at least another state corresponding to a second page read operation to reduce probability of error occurrence. The first page OVS operation and the second page read operation may be performed in pages (memory cells) connected to the same wordline. For example, the storage device 10 may check degradation information on one state using the first OVS operation in the OVS recovery code, and then may use the checked degradation information in the next read operation for at least another state to increase an error correction rate.

In addition, the storage device 10 may reflect a history read level in advance on another distribution valley correction in the same direction in a direction searched in the present OVS operation. Due to the history read level reflected in advance, the probability of UECC occurrence and an entry rate may be reduced.

Figure 2:
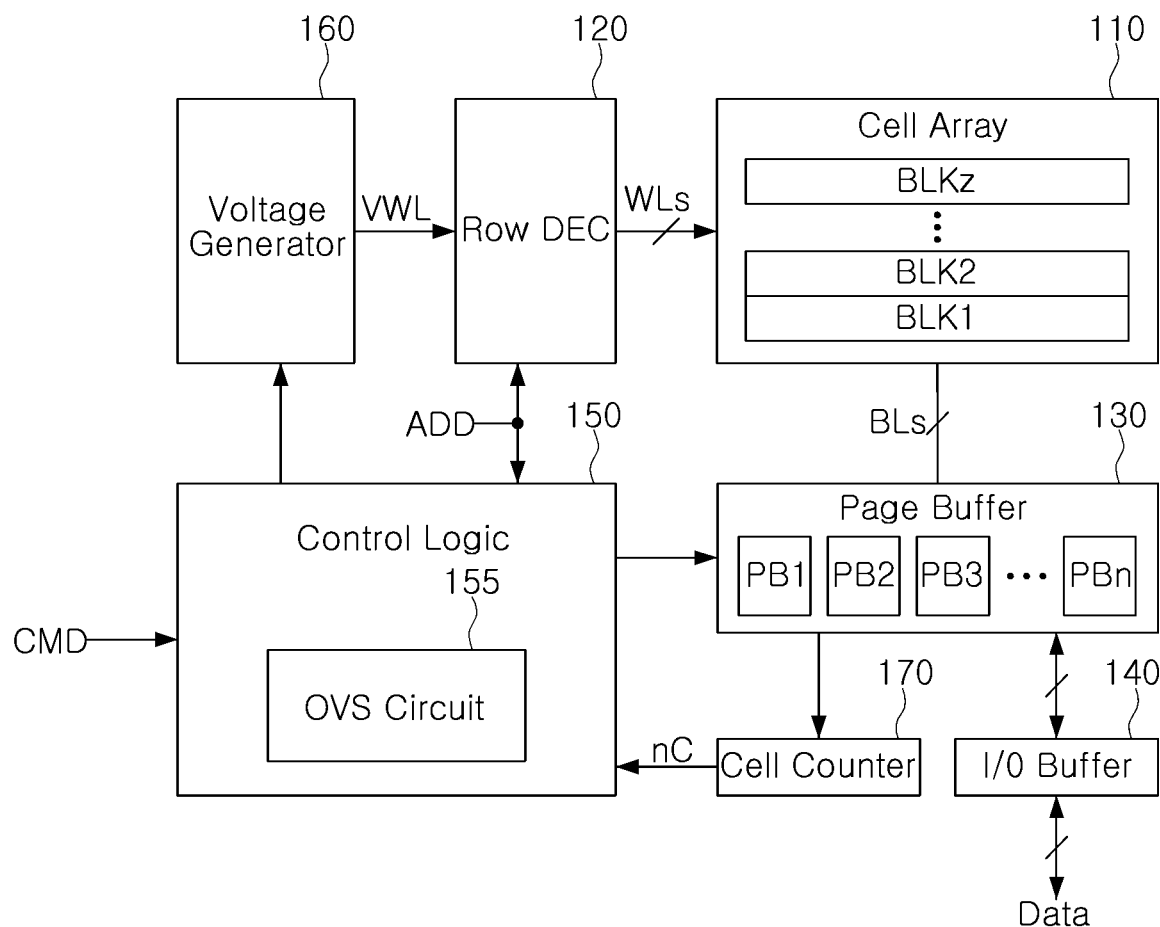
FIG. 2 is a view illustrating a nonvolatile memory device illustrated in FIG. 1.

FIG. 2 is a view illustrating a nonvolatile memory device 100 illustrated in FIG. 1. Referring to FIG. 2, the nonvolatile memory device 100 may include a memory cell array 110, a row decoder 120, a page buffer circuit 130, an input/output buffer circuit 140, a control logic circuit 150, and a voltage generator 160, and a cell counter 170.

The memory cell array 110 may be connected to the row decoder 120 through wordlines WLs or string select lines (SSL) and ground select lines (GSL). The memory cell array 110 may be connected to the page buffer circuit 130 through bitlines BLs. The memory cell array 110 may include a plurality of memory blocks BLK1 to BLKz. Each of the plurality of memory blocks BLK1-BLKz may include a plurality of cell strings. A channel of each of the cell strings may be formed in a vertical or horizontal direction. Each of the cell strings may include a plurality of memory cells. The plurality of memory cells may be programmed, erased, or read by a voltage provided to the bitlines BLs or the wordlines WLs. In general, a program operation is performed in units of pages, and an erase operation is performed in units of blocks. Detailed descriptions of the memory cells are disclosed in U.S. Pat. Nos. 7,679,133, 8,553,466, 8,654,587, 8,559,235, and 9,536,970. In an example embodiment, the memory cell array 110 may include a two-dimensional (2D) memory cell array, and the 2D memory cell array may include a plurality of NAND strings arranged in a row direction and a column direction.

The row decoder 120 may be configured to select one of the memory blocks BLK1 to BLKz of the memory cell array 110 in response to an address ADD. The row decoder 120 may select one of the wordlines of the selected memory block in response to the address ADD. The row decoder 120 may transmit a wordline voltage VWL, corresponding to an operation mode, to a wordline of the selected memory block. During a program operation, the row decoder 120 may apply a program voltage and a verify voltage to the selected wordline and may apply a pass voltage to an unselected wordline. During a read operation, the row decoder 120 may apply a read voltage to a selected wordline and may apply a read pass voltage to an unselected wordline.

The page buffer circuit 130 may be configured to operate as a write driver or a sense amplifier. During the program operation, the page buffer circuit 130 may apply a bitline voltage, corresponding to data to be programmed, to bitlines of the memory cell array 110. During the read operation or a verify read operation, the page buffer circuit 130 may detect data, stored in the selected memory cell, through a bitline BL. A plurality of page buffers PB1 to PBn (where n is an integer greater than or equal to 2), included in the page buffer circuit 130, may each be connected to at least one bitline.

Each of the plurality of page buffers PB1 to PBn may be configured to perform sensing and latching operations to perform an OVS operation. For example, each of the plurality of page buffers PB1 to PBn may perform a plurality of sensing operations to identify one state stored in selected memory cells under the control of the control logic circuit 150. In addition, each of the plurality of page buffers PB1 to PBn stores data sensed through a plurality of sensing operations, and then may select one of a plurality of pieces of data under the control of the control logic circuit 150. For example, each of the plurality of page buffers PB1 to PBn may perform a sensing operation two or more times to identify one state. In addition, each of the plurality of page buffers PB1 to PBn may select or output optimal data, among the plurality of pieces of data, under the control of the control logic circuit 150.

The input/output buffer circuit 140 may provide externally provided data to the page buffer circuit 130. The input/output buffer circuit 140 may provide an externally provided command CMD to the control logic circuit 150. The input/output buffer circuit 140 may provide an externally provided address ADD to the control logic circuit 150 or the row decoder 120. In addition, the input/output buffer circuit 140 may output data, sensed and latched by the page buffer circuit 130, to an external entity.

The control logic circuit 150 may be configured to control a row decoder 120 and a page buffer circuit 130 in response to the externally transmitted command CMD. In addition, the control logic circuit 150 may include an OVS circuit 155 to perform an OVS operation.

The OVS circuit 155 may control the page buffer circuit 130 and the voltage generator 160 to perform an OVS operation. The OVS circuit 155 may control the page buffer circuit 130 such that a plurality of sensing operations are performed to identify specific states of selected memory cells. The OVS circuit 155 may control the plurality of page buffers PB1 to PBn such that sensing data, corresponding to each of a plurality of sensing results, is stored in a plurality of latch sets provided in each of the plurality of page buffers PB1 to PBn. The OVS circuit 155 may perform processing to select optimal data, among a plurality of pieces of sensed data. The OVS circuit 155 may refer to a count result nC, provided from the cell counter 170, to select optimal data. For example, the OVS circuit 155 may control the page buffer circuit 130 to select and output a read result closest to a distribution valley, among the plurality of sensing results.

In addition, the OVS circuit 155 may store development time information corresponding to the OVS operation. The OVS circuit 155 may output the stored development time information to the controller 200 as detection information (OVSDI). In an example embodiment, the detection information (OVSDI) may be output using UIB out, or may be output in response to a specific command (for example, a get feature command, a status read command, or the like).

The voltage generator 160 may be configured to generate various types of wordline voltages to be respectively applied to wordlines under the control of the control logic circuit 150 and a well voltage to be provided to a bulk (for example, a well region) in which memory cells are formed. The wordline voltages, respectively provided to the wordlines, may include a program voltage, a pass voltage, a read voltage, a read pass voltage, and the like.

The cell counter 170 may be configured to count memory cells, each corresponding to a specific threshold voltage range, from data sensed in the page buffer circuit 130. For example, the cell counter 170 may process the data sensed in each of the plurality of page buffers PB1 to PBn to count the number of memory cells having a threshold voltage of a specific threshold voltage range.

The nonvolatile memory device 100 according to an example embodiment may execute an OVS recovery code to secure reliability of a read operation. The nonvolatile memory device 100 may reflect detection information (OVSDI) on a first page of a first OVS operation in advance on an HRT (see FIG. 1) as a read level for a second page, and may perform a second page read operation on the second page using a read level of the HRT (see FIG. 1) to reduce probability of error occurrence.

Figure 3:
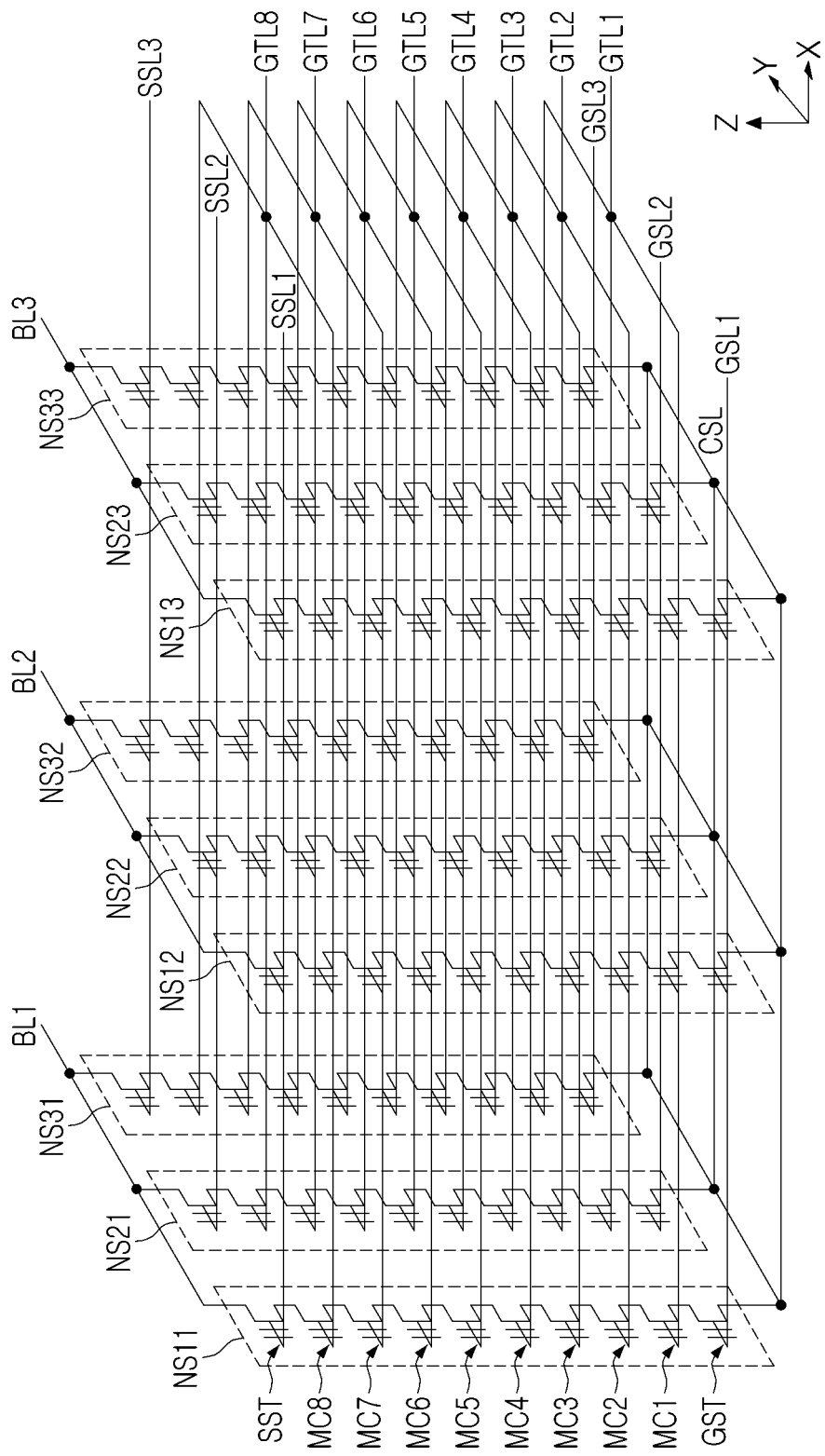
FIG. 3 is a circuit diagram of one memory block, among memory blocks illustrated in FIG. 1.

FIG. 3 is a circuit diagram of a memory block BLKi (where i is an integer greater than or equal to 2). A plurality of memory NAND strings, included in the memory block BLKi, may be formed in a direction perpendicular to a substrate.

Referring to FIG. 3, the memory block BLKi may include a plurality of memory NAND strings NS11-NS13, NS21-NS23, and NS31-NS33 connected between bitlines BL1, BL2, and BL3 and a common source line CSL. Each of the plurality of memory NAND strings NS11-NS13, NS21-NS23, and NS31-NS33 may include a string select transistor SST, a plurality of memory cells MC1, MC2, . . . , and MC8, and a ground select transistor GST. In FIG. 3, each of the plurality of memory NAND strings NS11-NS13, NS21-NS23, and NS31-NS33 is illustrated as including eight memory cells MC1, MC2, . . . , and MC8, but the present disclosure is not limited thereto.

The string select transistor SST may be connected to corresponding string select lines SSL1, SSL2, and SSL3. The plurality of memory cells MC1, MC2, . . . , and MC8 may be connected to corresponding gate lines GTL1, GTL2, . . . , and GTL8, respectively. The gate lines GTL1, GTL2, . . . , and GTL8 may correspond to wordlines, and some of the gate lines GTL1, GTL2, . . . , and GTL8 may correspond to dummy wordlines. The ground select transistor GST may be connected to corresponding ground select lines GSL1, GSL2, and GSL3. The string select transistor SST may be connected to corresponding bitlines BL1, BL2, and BL3, and the ground select transistor GST may be connected to a common source line CSL.

Wordlines (for example, GTL1) having the same height may be connected in common, and ground select lines GSL1, GSL2, and GSL3 and string select lines SSL1, SSL2, and SSL3 may be separated (e.g., electrically separated) from each other. In FIG. 3, the memory block BLK is illustrated as being connected to the eight gate lines GTL1, GTL2, . . . , and GTL8 and the three bitlines BL1, BL2, and BL3, but the present disclosure is not limited thereto.

Figure 4:
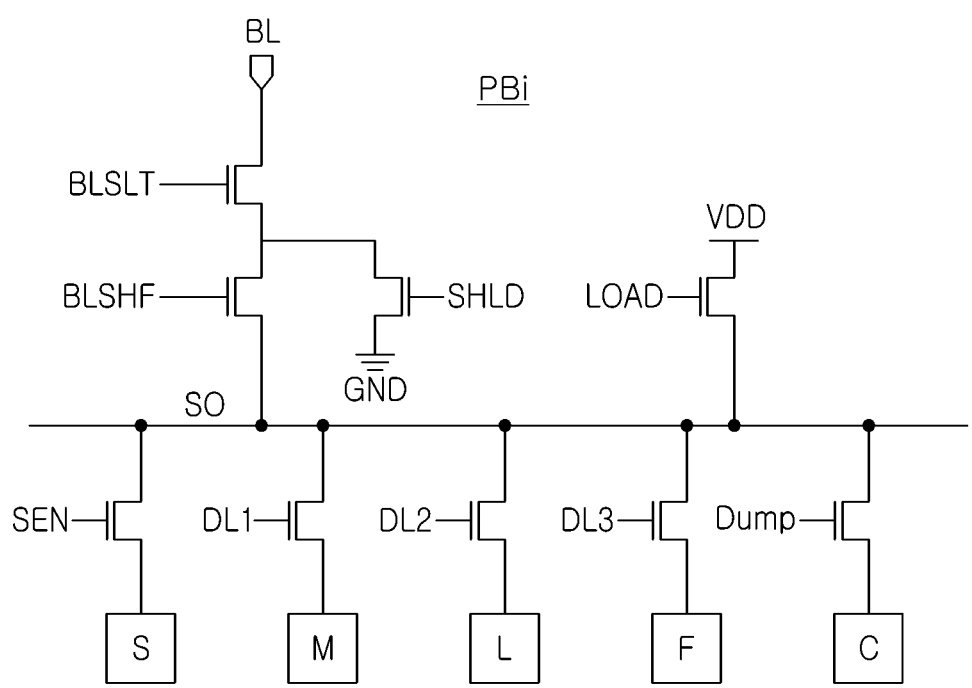
FIG. 4 is a view illustrating a page buffer according to an example embodiment.

FIG. 4 is a view illustrating a page buffer PBi (where i is a positive integer) according to an example embodiment. As illustrated in FIG. 4, the page buffer PBi may be connected to a cell string through a bitline BL. In a program operation, the page buffer PBi may set up or precharge the bitline BL. In a read operation, the page buffer PBi may precharge the bitline BL and sense whether the selected memory cell is turned on or turned off. The page buffer PBi may include transistors to supply a power supply voltage VDD to the bitline BL. In addition, the page buffer PBi may receive control signals BLSLT, BLSHF, SHLD, and LOAD for controlling transistors from the control logic circuit 150. The bitline BL may be precharged and developed on response to the control signals BLSLT, BLSHF, SHLD, and LOAD. Data of a sensing node S0, corresponding to the bitline BL, may be latched in response to switching signals SEN, DL1, DL2, DL3, and Dump.

In an example embodiment, the page buffer PBi connected to the bitline BL may be connected to memory cells of a NAND string. A page buffer PB may include a sensing node SO connected to the bitline BL. In addition, the page buffer PBi may include a plurality of latches S, M, L, F, and C, respectively connected to the sensing node SO. Among the plurality of latches S, M, L, F, and C, latches M, L, and F, for example, may store a most significant bit MSB, a central significant bit CSB, and a least significant bit LSB. In FIG. 4, the page buffer PBi is illustrated as including five latches. However, it will be understood that the number of latches of the present disclosure is not limited thereto.

Figure 5:
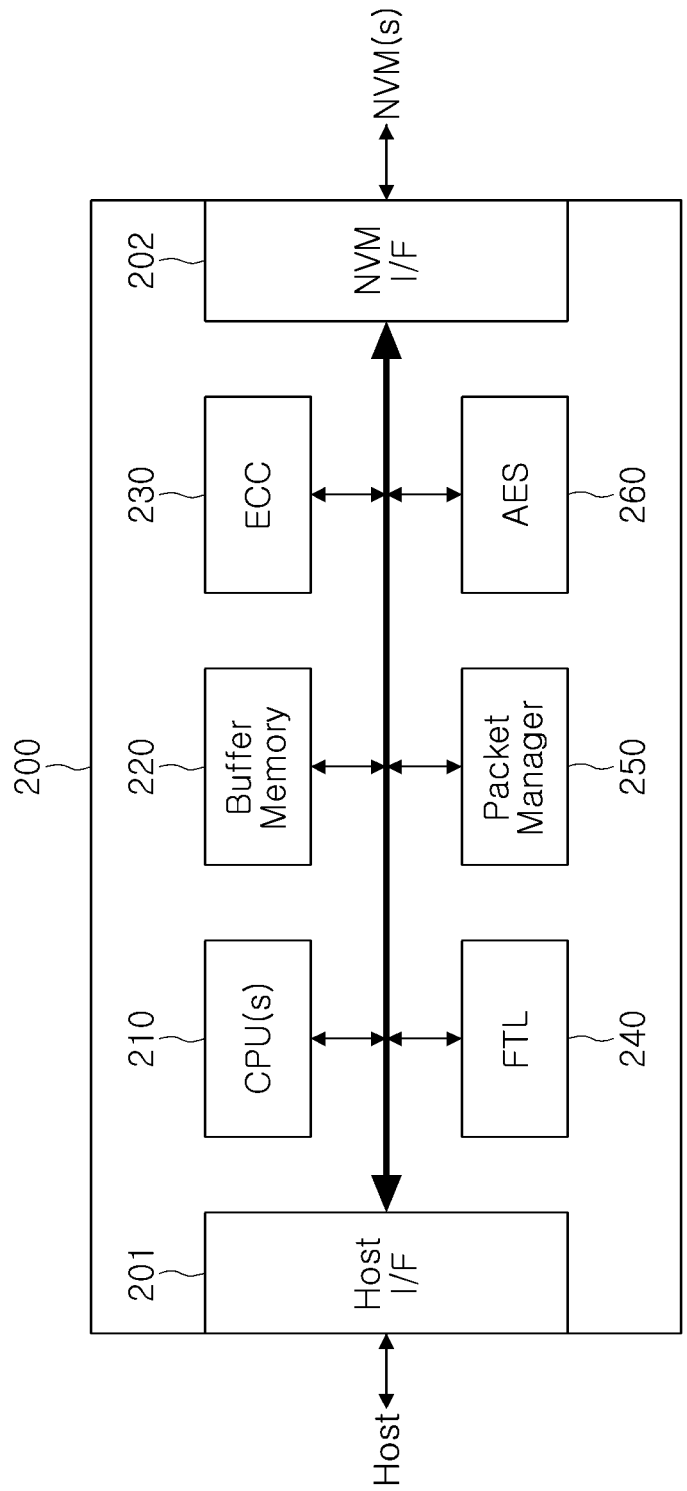
FIG. 5 is a view illustrating a controller according to an example embodiment.

FIG. 5 is a view illustrating a controller 200 according to an example embodiment.

Referring to FIG. 5, the controller 200 may include a host interface 201, a memory interface 202, at least one processor 210, a buffer memory 220, an error correction circuit 230, and a flash translation layer manager 240, a packet manager 250, and an encryption device 260.

The host interface 201 may be configured to transmit and receive a packet to and from a host. A packet, transmitted from the host to the host interface 201, may include a command or data to be written to nonvolatile memory 100. A packet, transmitted from the host interface 201 to the host, may include a response to the command or data read from the nonvolatile memory 100. The memory interface 202 may transmit data to be written to the nonvolatile memory 100 to the nonvolatile memory 100, or may receive read data from the nonvolatile memory 100. The memory interface 202 may be configured to comply with standards such as JEDEC Toggle standards or ONFI standards.

The flash translation layer manager 240 may perform various functions such as address mapping, wear-leveling, and garbage collection. An address mapping operation is an operation of converting a logical address, received from a host, into a physical address used to actually store data in the nonvolatile memory 100. The wear-leveling is a technique to prevent excessive degradation of a specific block by allowing blocks in the nonvolatile memory 100 to be uniformly used. For example, the wear-leveling may be implemented by a firmware technique to balance erase counts of physical blocks. The garbage collection is a technique to secure available capacity in the nonvolatile memory 100 in a manner of copying valid data of a block to a new block and then erasing an existing block.

The packet manager 250 may generate a packet according to a protocol of an interface negotiated with the host, or may parse various information from a packet received from the host. In addition, the buffer memory 220 may temporarily store data to be written to the nonvolatile memory 100 or data read from the nonvolatile memory 100. In an example embodiment, the buffer memory 220 may be an element provided in the controller 200. In another embodiment, the buffer memory 220 may be disposed outside the controller 200.

The encryption device 260 may perform at least one of an encryption operation and a decryption operation on data input to the processor 210 using a symmetric-key algorithm. The encryption device 260 may encrypt and decrypt data using an advanced encryption standard (AES) algorithm. The encryption device 260 may include an encryption module and a decryption module.

Figure 6:
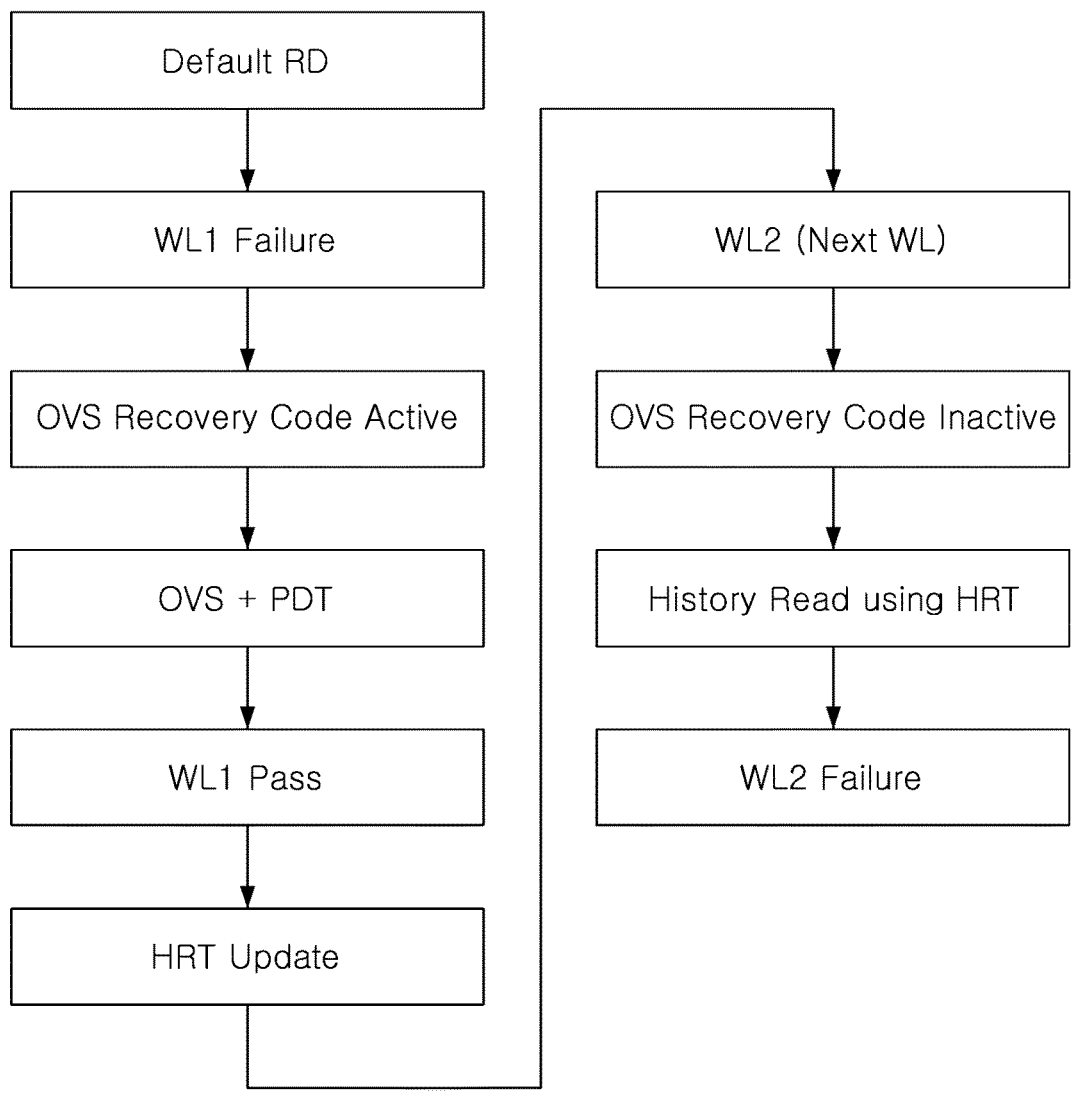
FIG. 6 is a flowchart illustrating a read operation using OVS in a typical storage device.

FIG. 6 is a flowchart illustrating a read operation using OVS in a typical storage device.

It will be assumed that a read operation is performed on memory cells connected to a first wordline WL1 (e.g., GTL1) using a default read level. When such a read operation fails, the OVS operation on memory cells connected to the first wordline WL1 may be enabled. For example, a nonvolatile memory device may enter a recovery code. The OVS operation may be performed by reflecting a pre-defined table PTD. When a read operation on the memory cells connected to the first wordline WL1 passes through such an OVS operation, a history read table HRT may be updated. In this case, offset information of the PDT used in the OVS operation may be updated in the HRT.

Then, when a read operation is performed on memory cells connected to the next wordline, for example, a second wordline WL2 (e.g., GTL2), the OVS operation may be disabled. For example, a read operation may be performed on memory cells connected to the second wordline WL2 while the recovery code is disabled. In this case, a history read operation may be performed using the updated HRT. In a typical storage device, since an optimal read level offset searched in an OVS operation is not reflected on an HRT, there is a high probability that a read operation of memory cells connected to the next wordline fails.

The storage device 10 according to an example embodiment may reflect detection information (OVSDI) (see FIG. 1) on the history read level table (HRT), irrespective of whether the OVS operation passes or fails, to use an optimum read level in the next read operation (an OVS operation or a normal read operation).

Figure 7A:
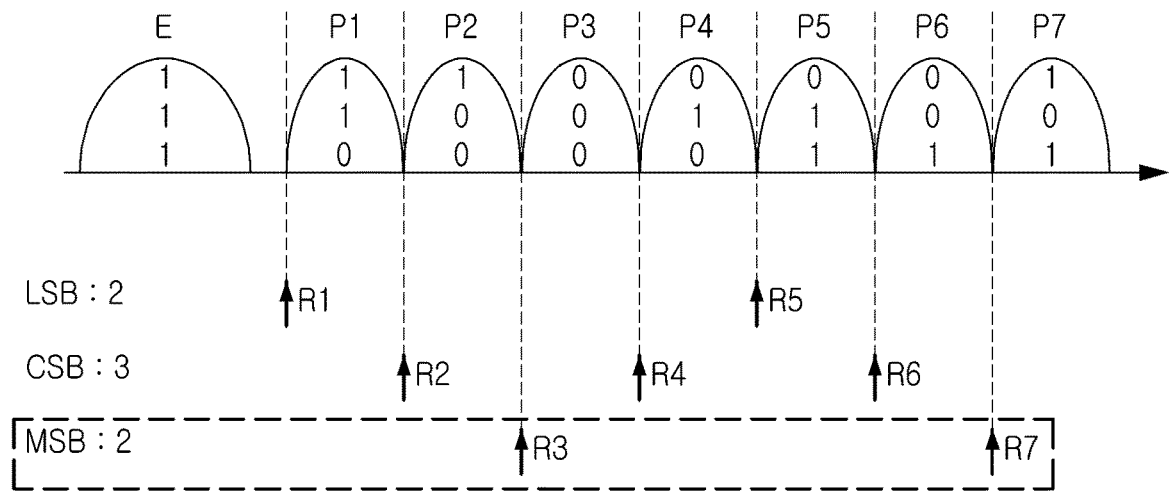
FIGS. 7A and 7B are conceptual diagrams illustrating extraction of a read level according to an OVS operation in a storage device according to an example embodiment.
Figure 7B:
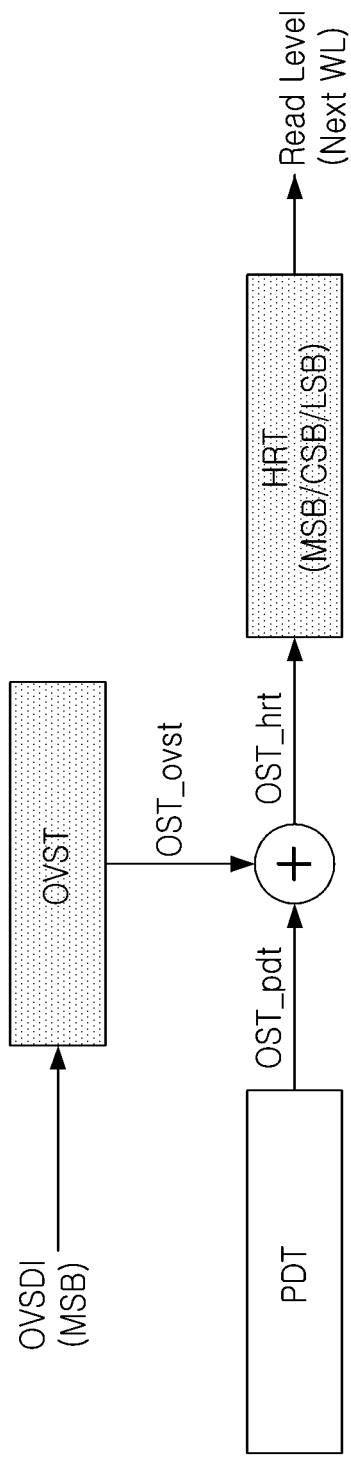

FIGS. 7A and 7B are conceptual diagrams illustrating extraction of a read level according to an OVS operation in a storage device 10 according to an example embodiment.

Referring to FIG. 7A, for ease of description, it will be assumed that the memory cell is a triple-level cell (TLC) and, in a read operation of the TLC, a most significant bit (MSB), a central significant bit (CSB), and a least significant bit (LSB) are read in order. However, a page reading order of the present disclosure is not limited thereto. As illustrated in FIG. 7A, the TLC may be programmed to one of an erase state E and program states P1 to P7. FIG. 7A further illustrates read levels R1 to R7 which correspond to each of the program states P1 to P7.

An MSB page read operation may include an OVS operation based on a fourth read level R3 and an OVS operation based on a seventh read level R7. A CSB page read operation may include an OVS operation based on a second read level R2, an OVS operation based on a fourth read level R4, and an OVS operation based on a sixth read level R6. An LSB page read operation may include an OVS operation based on the first read level R1 and an OVS operation based on the fifth read level R5. Each OVS operation may include an OVS sensing operation for determining a detection case and a main sensing operation based on the detection case. It will be understood that read levels of the MSB, CSB, and LSB page read operation are not limited to those illustrated in FIG. 7A.

Referring to FIG. 7B, the storage device 10 may update a history read level table (HRT) using a pre-defined table (PDT) or an OVS table (OVST) to extract an optimal read level.

The detection information (OVSDI) (see FIG. 1) may include a result corresponding to a detection case based on an OVS operation of an MSB page read operation. A second read level offset OST_ovst, corresponding to the detection information (OVSDI), may be reflected on an OVST.

In an example embodiment, a third read level offset OST_hrt may be determined using a first read level offset OST_pdt and the second read level offset OST_ovst. For example, the third read level offset OST_hrt may be determined by adding the second read level offset OST_ovst to the first read level offset OST_pdt according to the lapse of a program time. On the other hand, it will be not be understood that the third read level offset OST_hrt is determined by a simple addition of the first read level offset OST_pdt or the second read level offset OST_ovst. In addition, the third read level offset OST_hrt may be determined by applying a weight to each of the first and second read level offsets OST_pdt and OST_ovst.

The storage device 10 according to an example embodiment may reflect the read level offset OST_ovst of the OVS operation of the MSB page read operation not only on an HST for performing the MSB page read operation, but also on an HST for performing CSB and LSB page read operation in advance, so that an optimum read level may be rapidly searched in the next page operation.

In general, sensing a sensing node of a page buffer several times at a point in time with different development times may have the same effect as precharging and sensing a bitline by varying a wordline voltage.

Figure 8A:
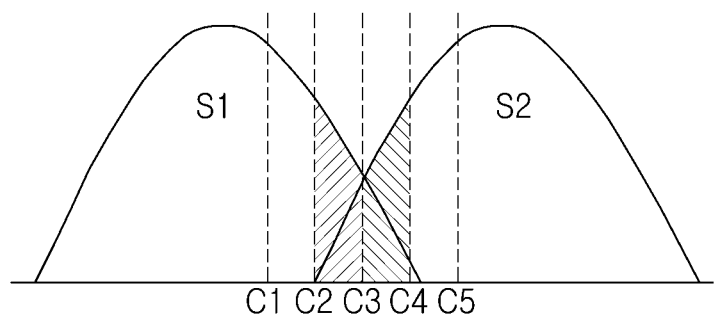
FIGS. 8A and 8B are conceptual diagrams illustrating different read levels of distribution valleys and corresponding development times.
Figure 8B:
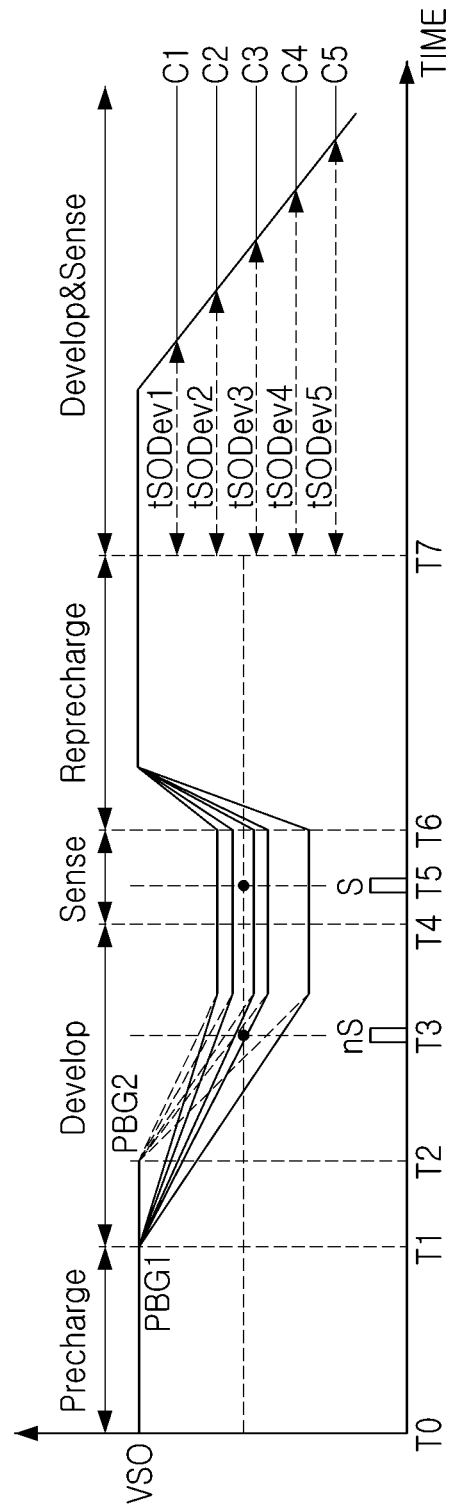

FIGS. 8A and 8B are conceptual diagrams illustrating different read levels of distribution valleys and corresponding development times. As illustrated in FIG. 8A, an OVS operation for searching distribution valleys of states S1 and S2 may be performed by a plurality of sensing operations. The plurality of sensing operations may be simultaneously performed in each of a plurality of page buffer groups.

Referring to FIG. 8B, an on-chip valley search (OVS) operation may be performed in such a manner that first page buffers PGB1 and second page buffers PGB2 sequentially latch sensing nodes at the same points in time during different development periods to store a sensing result.

A precharge operation may be performed from a point in time T0 to a point in time T1. A first bitline and a first sensing node, connected to each of the first page buffers PBG1, may be charged to perform the precharge operation. When bitline set-up signals are enabled, activated, the sensing node and the first bitline may be precharged to a specific level. When the first bitline set-up signal is disabled to a high level at the point in time T1, a precharge circuit of each of the first page buffers PBG1 may be turned off. In addition, when the second bitline set-up signal is disabled to a high level at a point in time T2 after the point in time T1, a precharge circuit of each of the second page buffers PBG2 may be turned off. In this case, a level of a sensing node of each of the first page buffers PBG1 and a level of a sensing node of each of the second page buffers PBG2 may vary according to the magnitude of current flowing to a corresponding bitline according to whether a memory cell is turned on or turned off.

As illustrated in FIG. 8B, each of the first page buffers PBG1 may precharge a sensing node from a point in time T0 to a point in time T1, and may develop first bitlines from the point in time T1 to a point in time T4. Each of the second page buffers PBG2 may precharge a sensing node from the point in time T0 to the point in time T1, and may develop second bitlines from a point in time T2, later than the point in time T1, to a point in time T4.

A first sensing operation may include a latch reset (nS) sensing operation, performed at a point in time T3, and a latch set (S) sensing operation at a point in time T5. First cell count information may be calculated using an ON-cell count value of the latch reset (nS) sensing operation and the latch set (S) sensing operation in the first page buffers PGB1. Second cell count information may be calculated using the ON-cell count value of the latch reset (nS) sensing operation and the latch set (S) sensing operation in the second page buffers PGB2. A detection case (one of C1 to C5), corresponding to an optimal read level corresponding to a distribution valley, may be determined based on the first and second cell count information of the first sensing operation. Development times tSODev1 to tSODev5 of the second sensing operation, corresponding to the determined detection case, may be determined.

Figure 9:
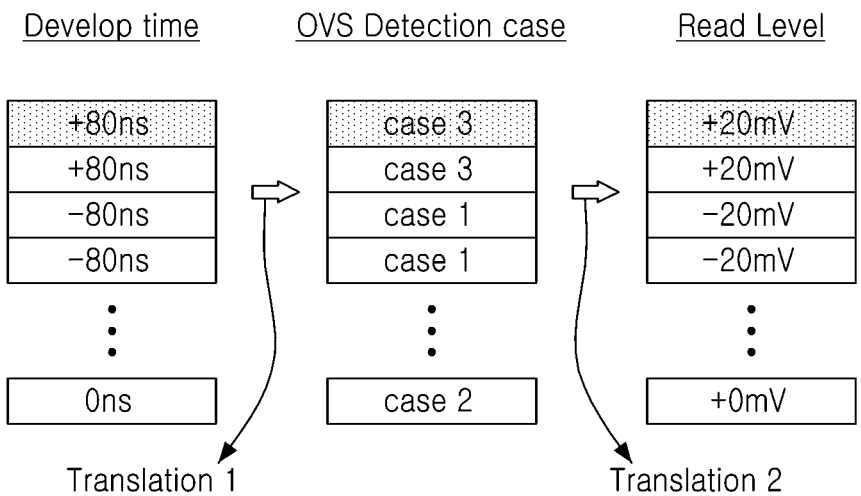
FIG. 9 is a conceptual diagram illustrating correction of a read level using OVS according to an example embodiment.

FIG. 9 is a conceptual diagram illustrating correction of a read level using OVS according to an example embodiment.

An offset of a development time, corresponding to an optimal distribution valley according to an OVS operation, may be determined. In the case of a most significant page, an offset of a development time is +80 ns. In this case, a detection case of the OVS operation may correspond to a third detection case C3. The OVS circuit 155 (see FIG. 1) of the nonvolatile memory device 100 (see FIG. 1) may perform a first conversion operation on a detection case corresponding to an optimal development time of the OVS operation. The OVS circuit 155 may store or latch data bits for each detection case.

Then, detection information (OVSDI) (see FIG. 1) from the nonvolatile memory device 100 may be output from the controller 200 (see FIG. 1). The controller 200 may generate an OVST with a corresponding read level offset +20 mV using detection information, for example, the OVS detection case C3. In this case, the controller 200 may perform a second conversion operation on a read level corresponding to the OVS detection case using the OVST. Ultimately, the controller 200 may update an offset, according to the OVS operation, in an HRT.

FIGS. 10A, 10B, 10C, and 10D are conceptual diagrams of a reading method of a storage device according to an example embodiment.

Figure 10A:
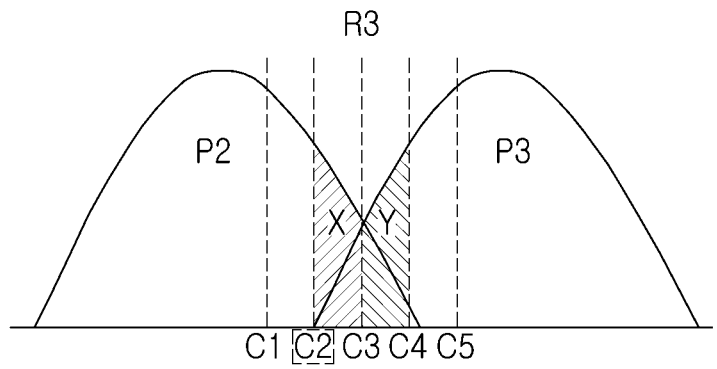
Figure 10B:
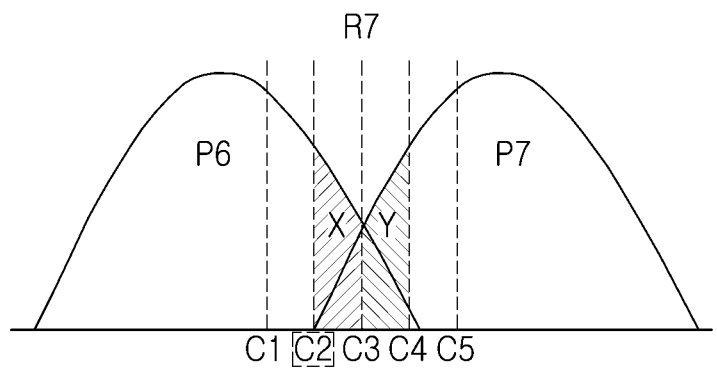

In an MSB page read operation, a second detection case C2 may be determined as a result of an OVS operation based on a third read level R3 as illustrated in FIG. 10A, and a second detection case C2 may be determined as a result of an OVS operation based on a seventh read level R7 as illustrated in FIG. 10B.

The read level compensation unit 211 (see FIG. 1) of the storage device 10 may confirm, based on detection information (OVSDI), that both a detection case of a first OVS operation corresponding to the third read level R3 and a detection case of a second OVS operation corresponding to the seventh read level R7 are the second detection case C2 in the MSB read operation, and may update offsets of the read levels R1 to R7, respectively corresponding to all states P1 to P7, in a history read level table (HRT) using an OVS table (OVST), as illustrated in FIG. 10. The read level compensation unit 211 may compensate for the third and seventh read levels R3 and R7 using detection information (OVSDI), corresponding to the third and seventh read levels R3 and R7 of the MSB page read operation, and may compensate for the other read levels R1, R2, R4, R5, and R6 in advance.

Since both of the detection cases of the first OVS operation and the second OVS operation are the second detection case C2 in the MSB page read operation, there is a high possibility that the detection case of the OVS operation corresponding to the other states is the second detection case C2. For example, there is a high possibility that memory cells connected to a single wordline will be degraded in the same direction. Accordingly, offsets corresponding to the second detection case C2 may be reflected in advance on the HRT in the other states of the OVST illustrated in FIGS. 10C and 10D.

Updating an OVS table (OVST) to a history read level table (HRT) may be determined according to a degradation direction of a memory cell obtained from the detection information of the MSB page read operation.

Figure 11A:
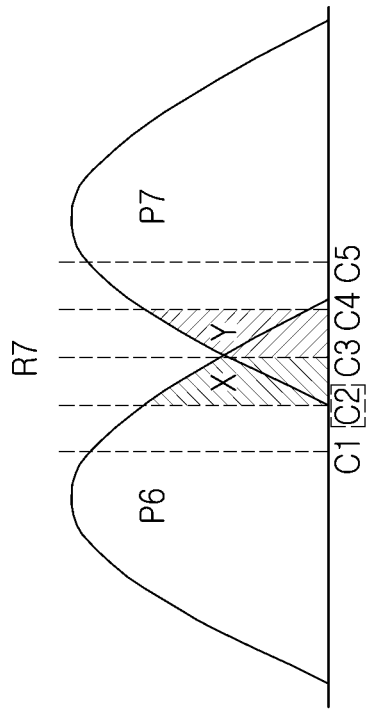
FIGS. 11A, 11B, and 11C are views illustrating three cases associated with degradation directions for determining whether an OVST is updated in an HRT.
Figure 11A:
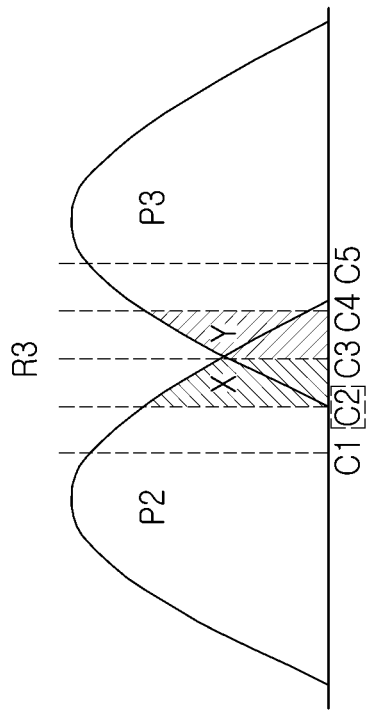
Figure 11B:
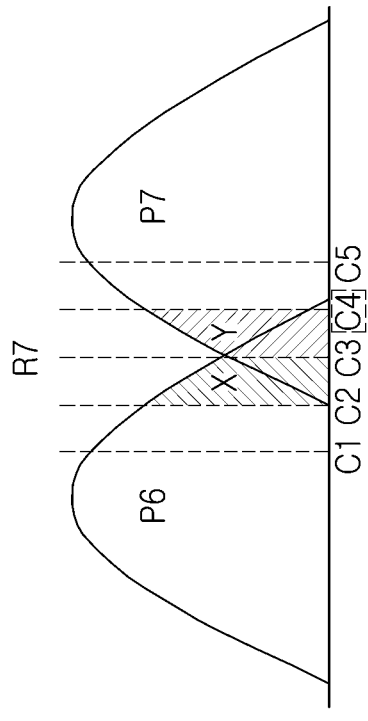
Figure 11B:
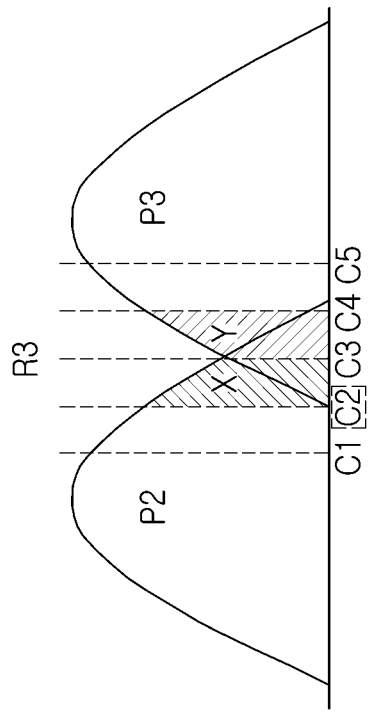
Figure 11C:
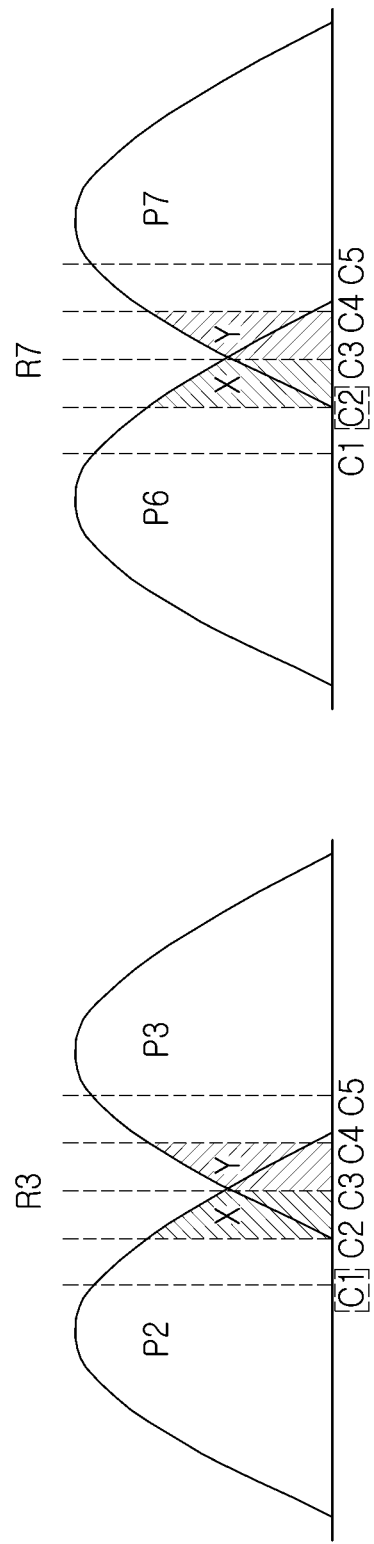

FIGS. 11A, 11B, and 11C are views illustrating three cases associated with degradation directions for determining whether OVST is updated in an HRT.

Referring to FIG. 11A, both a detection case of a first OVS operation (for example, R3 OVS sensing) and a detection case of a second OVS operation (for example, R7 OVS sensing) are the same in an MSB page read operation. This is a case in which degradation directions are the same and the degrees of degradation are similar to each other. In this case, the read level compensation unit 211 may update offsets for all states to an HRT using an OVST.

Referring to FIG. 11B, in an MSB page read operation, a first OVS operation (for example, R3 OVS sensing) may indicate a second detection case (for example, C2), and a second OVS operation (for example, R7 OVS sensing) may indicate a fourth detection case C4. The second detection case C2 and the fourth detection case C4 are located in opposing directions with respect to a distribution valley, which means that degradation directions do not match each other. Accordingly, the read level compensation unit 211 may update only offsets for the third and seventh read levels R3 and R7 in an HRT using an OVST.

Referring to FIG. 11C, in an MSB page read operation, a first OVS operation (for example, R3 OVS sensing) may indicate a first detection case (for example, C1), and a second OVS operation (for example, R7 OVS sensing) may indicate a second detection case C2. The first detection case C1 and the second detection case C2 are located in the same direction with respect to a distribution valley, which means that degradation directions are the same. Accordingly, the read level compensation unit 211 may update offsets for the third and seventh read levels R3 and R7 in an HRT using an OVST, and may update appropriate offsets for the other read levels R1, R2, R4, R5, and R6 (for example, an offset corresponding to the second detection case C2 may be updated) in the HRT using the OVST.

As discussed above, first, when degradation directions are the same and OVS operations of the MSB page indicate the same detection case (for example, C2 of FIG. 11A), offsets for all states may be updated in an HRT using an OVST. Second, when degradation directions are different from each other, only offsets of read levels R3 and R7 corresponding to detection cases (C2 and C4 of FIG. 11B) of a first OVS operation may be updated in an HRT. Third, when degradation directions are the same and OVS operations indicate different detection cases (C1 and C2 of FIG. 11C), offsets of read levels R3 and R7 corresponding to the detection cases (C1 and C2) and offsets of read levels R1, R2, R4, R5, and R6 of relatively less degraded detection case C2, among the different cases C1 and C2, may be updated in an HRT using an OVST.

It will be understood that degradation directions and detection cases and a description regarding whether an offset is updated in an HRT are not limited thereto.

FIGS. 12A and 12B are views illustrating an example of HRT update when degradation directions are the same and different detection cases are indicated. For ease of description, it will be assumed that a first detection case C1 is indicated in a first OVS operation based on a third read level R3 of an MSB page read operation, and a second detection case C2 is indicated in a second OVS operation based on a seventh read level R7, as illustrated in FIG. 11C.

The first and second detection cases C1 and C2 may mean that memory cells, connected to a wordline around a distribution valley, are subjected to retention degradation. In this case, a read level compensation unit (see 211 of FIG. 1) may update offsets (−32 mV, −24 mV, −16 mV, −32 mV, −48 mV, −64 mV, and −80 mV of all read levels R1 to R7 in an HRT using an OVST to be appropriate to the detection case C2 indicating minimum degradation. A detection case of the first OVS operation based on the third read level R3 is the first detection case C1, but an offset for the third read level R3 may be updated in the HRT by an offset (−16 mV) corresponding to the second case C2 of the second OVS operation based on the seventh read level R7.

Figure 13:
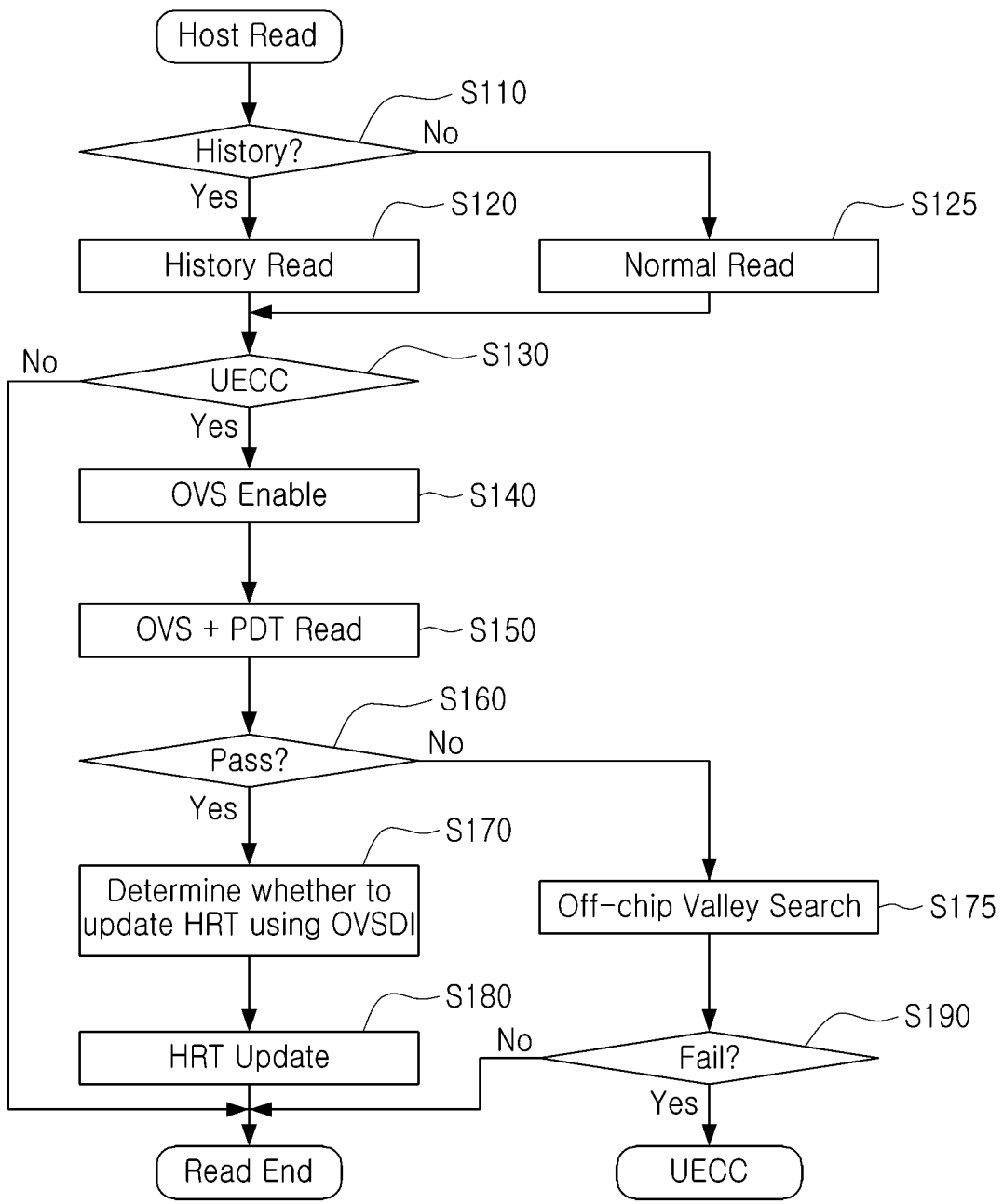
FIG. 13 is a flowchart illustrating a reading method of a storage device according to an example embodiment.

FIG. 13 is a flowchart illustrating a reading method of a storage device according to an example embodiment. Hereinafter, a reading method will be described with reference to FIGS. 1 to 13.

A read request (i.e., current read request) may be received from a host (an external entity) to the storage device 10. The storage device 10 may determine a history of such a read request. The storage device 10 may determine whether the received read request has been previously stored in a history buffer (S110). When the received read request has been previously stored in the history buffer, a history read operation may be performed (S120). In the history read operation, a read operation may be performed at an optimum read voltage level included in an HRT. When the received read request has not been previously stored in the history buffer, a normal read operation may be performed (S125). In the normal read operation, a read operation may be performed at a default read voltage level.

A determination may be made as to whether an uncorrectable error UECC has occurred as a result of the history read operation or the normal read operation (S130). The UECC means that read data is uncorrectable by the ECC circuit 130 (see FIG. 1). When the UECC has not occurred, the read operation will be immediately finished. Meanwhile, when the UECC has occurred, an OVS mode may be enabled, for example, the OVS recovery code may be entered (S140), and the nonvolatile memory device 100 (see FIG. 1) may perform a read retry operation based on the OVS mode. The read retry operation may include a read operation using a PDT and an OVS. For example, the read retry operation may be performed by performing a read voltage level offset and an OVS operation of the PDT (S150).

Then, a determination may be made as to whether the read retry operation passes (S160). When a read retry operation passes as a result of the determination, OVS operation detection information OVSDI may be received by the controller 200 (see FIG. 1), and the read level compensation unit 211 (see FIG. 1) of the controller 200 may determine offset information corresponding to OVS detection information (OVSDI) using an OVS table (OVST). Based on the offset information, a determination may be made as to whether the HRT is updated (S170). The read level compensation unit 211 may update offset information of the OVST and offset information of the PDT in the history read level table (HRT), as described in FIGS. 1 to 12 (S180). The read level compensation unit 211 may compensate for at least one read level for the next page corresponding to a wordline using a degradation direction and the detection information (OVSDI) for a current page corresponding to the wordline.

When the read retry operation fails, the controller 200 may perform an off-chip valley search operation to recover data (S190). The off-chip valley search means that a distribution valley is searched by sequentially scanning predetermined voltage periods while increasing or decreasing by a predetermined voltage by the controller 200.

A read operation may be performed based on the distribution valley according to the off-chip valley search operation, and a determination may be made as to whether a result obtained by performing the read operation fails (S120). When the result does not fail, the read operation may be finished. Meanwhile, when the read operation fails, an UECC for a read request from the host may occur. The generated UECC may be output to the host.

Figure 14:
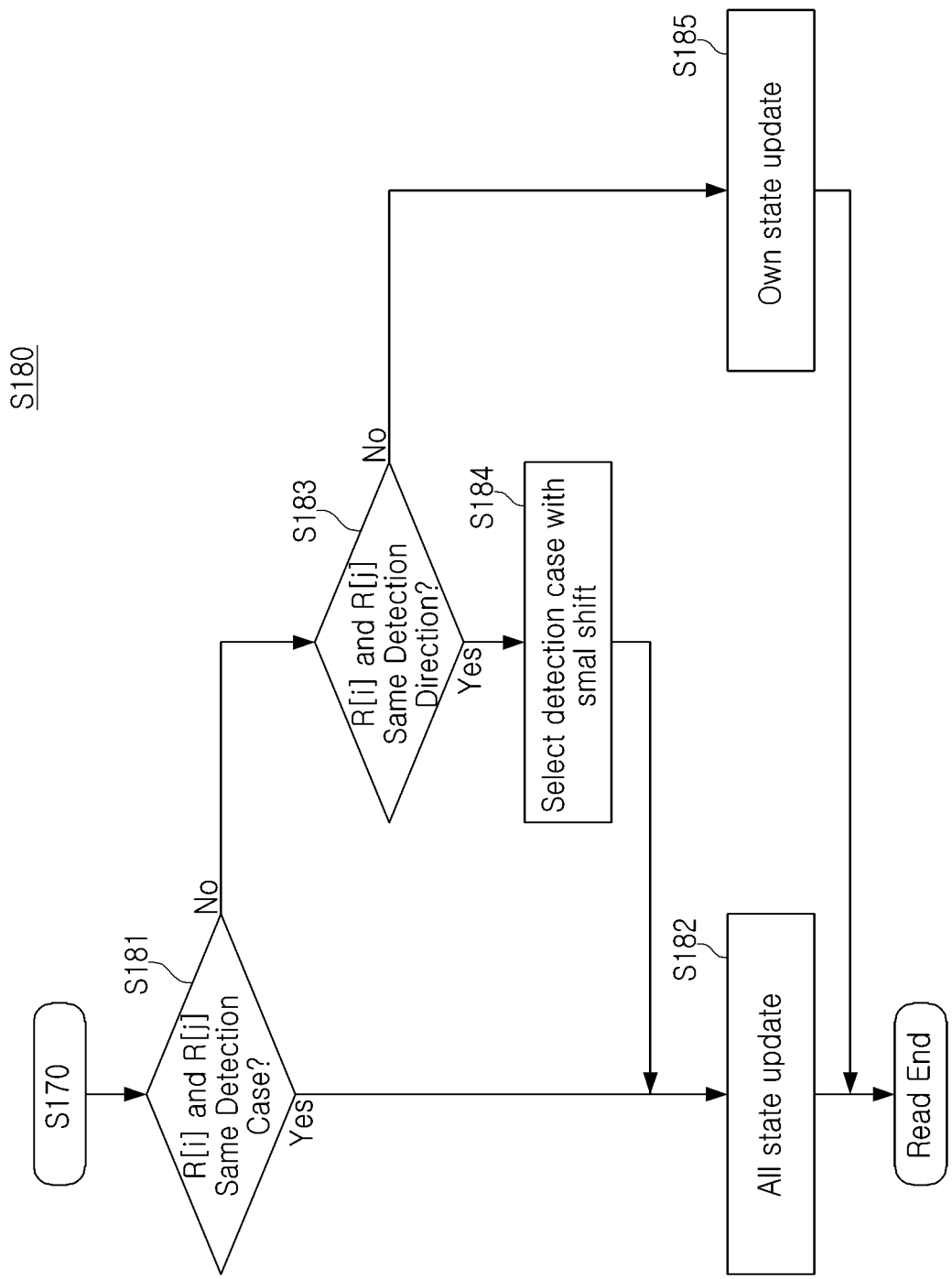
FIG. 14 is a flowchart illustrating a detailed operation of updating HRT of FIG. 13.

FIG. 14 is a flowchart illustrating a detailed operation of updating HRT of FIG. 13. Hereinafter, an operation of updating the HRT using detection information OVSDI will be described with reference to FIG. 14.

A determination may be made as to whether in a first page read operation (for example, an MSB page read operation), a detection case of a first level R[i] (where i is a positive integer) and a detection case of a second level R[j] (where j is a positive integer, other than i) are the same (S181).

When the detection case of the first level R[i] and the detection case of the second level R[j] are the same, the read level compensation unit 211 (see FIG. 1) may update offsets for all states using an OVST (S182).

When the detection case of the first level R[i] and the detection case of the second level R[j] are not the same, a determination may be made as to whether a detection direction of the first level (R[i]) and a detection direction of the second level R[j] are the same (S183). When the detection direction of the first level R[i] and the detection direction of the second level R[j] are the same, the read level compensation unit 211 may select a detection case having a small shift (S184), and a flow may enter the operation S182 such that the read level compensation unit 211 updates offsets corresponding to a selected detection case in the HRT using the OVST.

Meanwhile, when the detection direction of the first level R[i] and the detection direction of the second level R[j] are not the same, the read level compensation unit 211 may update only a read level corresponding to the detection case of the first level R[i]) and a read level corresponding to the detection case of the second level R[j] in the HRT (S185).

Figure 15A:
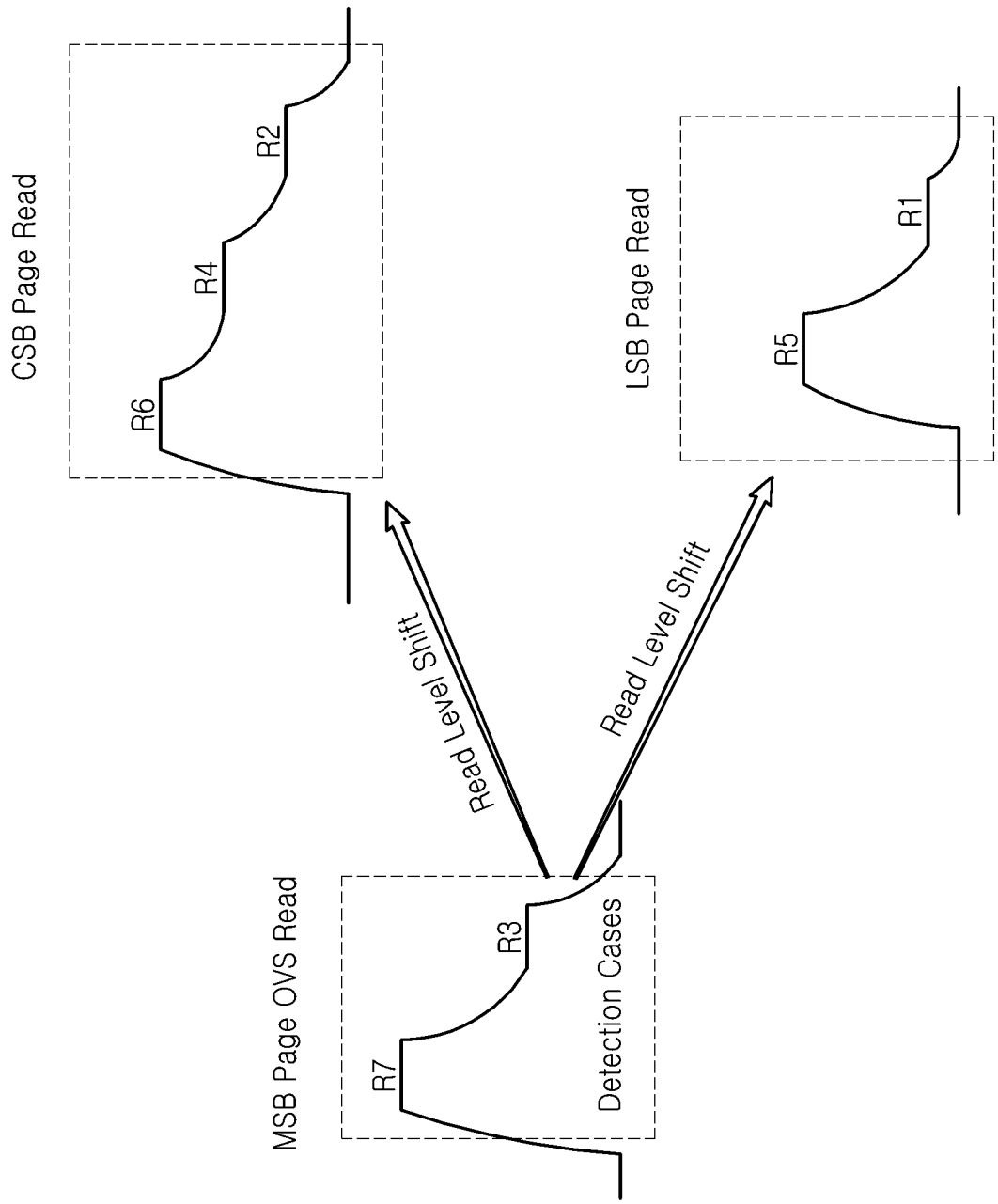
FIGS. 15A and 15B are views illustrating a sequence of a read operation of a storage device according to an example embodiment.
Figures 15B, 16:
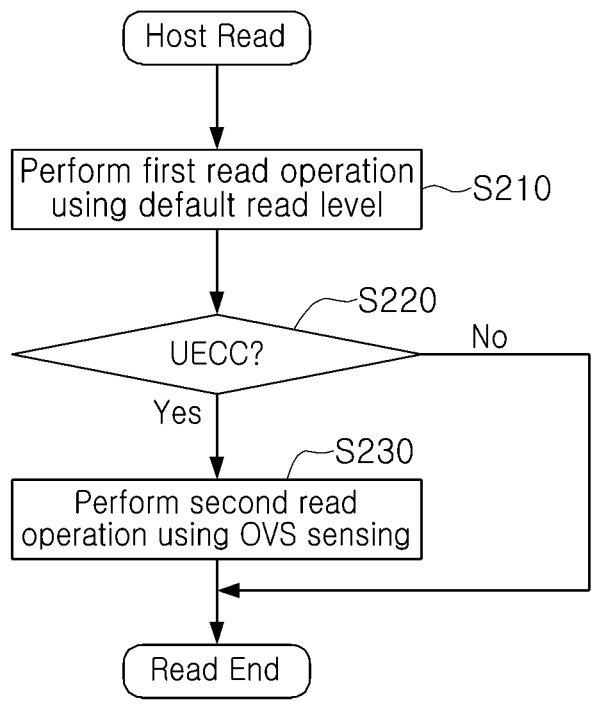
FIG. 16 is a flowchart illustrating a reading method of a storage device according to another example embodiment.

FIGS. 15A and 15B are views illustrating a sequence of a read operation of a storage device 10 according to an example embodiment.

Referring to FIG. 15A, a read operation of an OVS recovery code may be performed in such a manner than an MSB page OVS operation is performed, and then a CSB page read operation or an LSB page read operation is performed.

An MSB page OVS operation may be performed in such a manner that a first OVS operation on a seventh read level R7 and a second OVS operation on a third read level R3 are sequentially performed.

A CSB page read operation may be performed in such a manner that a first read operation on a sixth read level R6 changed based on detection information of the MSB page OVS operation, a second read operation on a fourth read level R4 changed based on the detection information of the MSB page OVS operation, and a third read operation on a second read level R2 changed based on the detection information of the MSB page OVS operation may be sequentially performed.

An LSB page read operation may be performed in such a manner that a first read operation on a fifth read level R5 changed based on detection information of the MSB page OVS operation and a second read operation on a first read level R1 changed based on the detection information of the MSB page OVS operation are sequentially performed.

In the read operation of the OVS recovery code according to an example embodiment, read levels of a CSB page read operation or an LSB page read operation may be changed using detection cases and an OVS table (OVST) for the MSB page OVS operation.

The operation order of each of the MSB, CSB, and LSB page read operations may be changed in various manners.

Referring to FIG. 15B, an LSB page read operation may be performed in such a manner that a read operation on the first read level R1 is performed, and then a read operation on the fifth read level R5 is performed.

A CSB page read operation may be performed in such a manner that a read operation on the second read level R2, a read operation on fourth read level R4, and a read operation on the sixth read level R6 are performed in order. In contrast, the CSB page read operation may be performed in such a manner that a read operation on the sixth read level R6, a read operation on the fourth read level R4, and a read operation on the second read level R2 are performed in order.

An MSB page read operation may be performed in such a manner that a read operation on the seventh read level R7 is performed, and then a read operation on the third read level R3 is performed.

It will be understood that the read sequence illustrated in FIG. 15B is only an example.

FIG. 16 is a flowchart illustrating a reading method of a storage device 10 according to another example embodiment. Hereinafter, a read operation of the storage device 10 will be described with reference to FIGS. 1 to 16.

The nonvolatile memory device 100 (see FIG. 1) may perform a first read operation using a default read level in response to a normal read command transmitted from the controller 200 (see FIG. 1) (S210). In this case, information corresponding to the default read level may be transmitted from the controller 200 together with the normal read command. The default read level information may include offset information of a history read level table (HRT).

The controller 200 may determine whether a UECC has occurred as a result of the first read operation (S220). When the UECC has not occurred, the read operation may be finished.

When the UECC has occurred, the nonvolatile memory device 100 may perform a second read operation using OVS sensing in response to an OVS read command transmitted from the controller 200. In the OVS sensing, offset information of a read level may be updated in a history read level table (HRT) using detection information OVSDI and an OVS table (OVST) associated with a detection case of a first page OVS operation, and a next page read operation (a normal or history read operation) may be performed using the HRT. Thus, the read operation may be finished.

Figure 17:
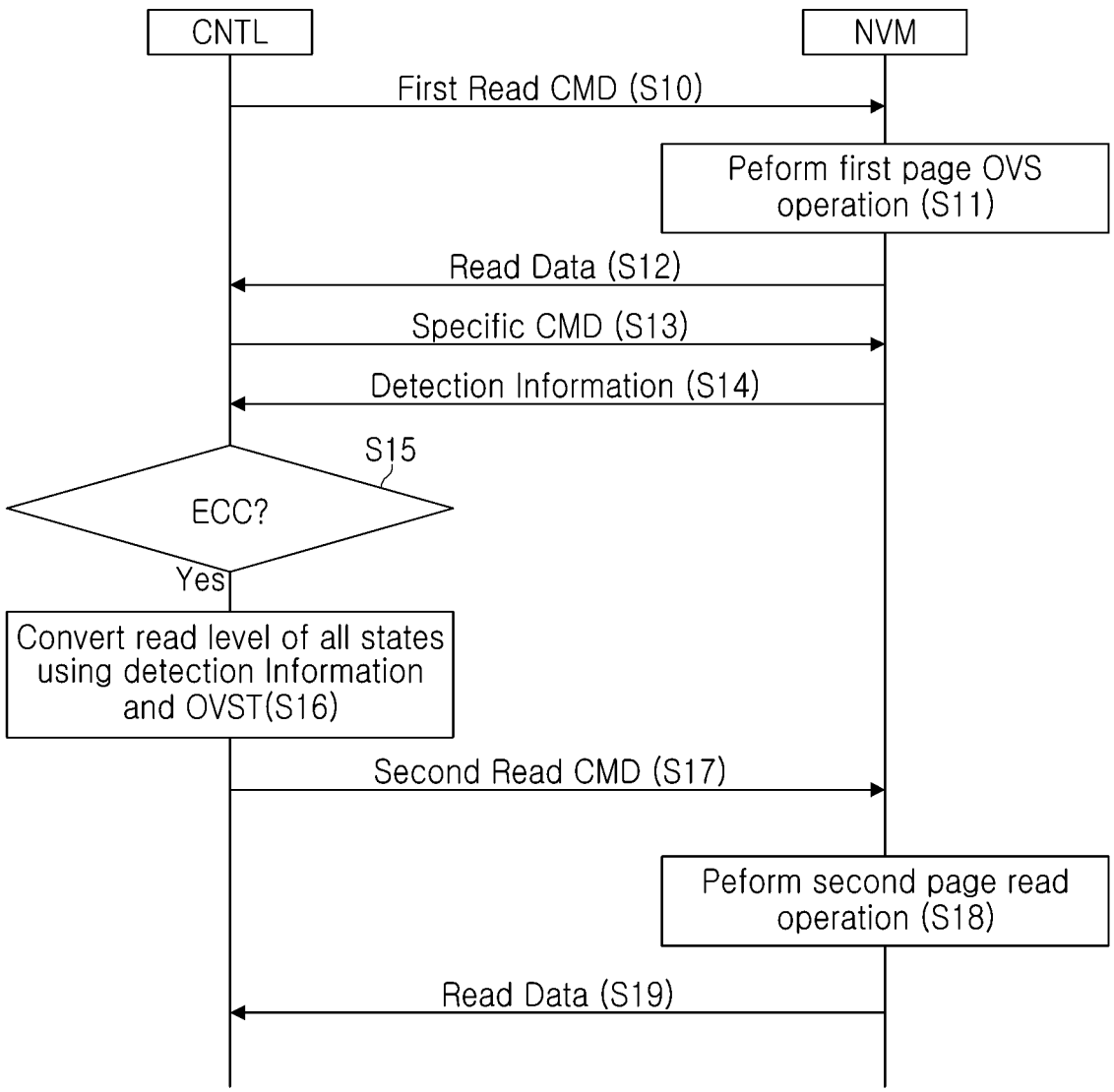
FIG. 17 is a ladder diagram illustrating an OVS recovery code process of a storage device according to an example embodiment.

FIG. 17 is a ladder diagram illustrating an OVS recovery code process of a storage device according to an example embodiment. Hereinafter, an OVS recovery code process of the storage device 10 will be described with reference to FIGS. 1 to 17.

A controller CNTL may transmit a first read command (an OVS read command) according to OVS recovery code entry to a nonvolatile memory device NVM (S10). The nonvolatile memory device NVM may perform a first page OVS operation in response to the first read command (S11). Data, read through the first page OVS operation, may be transmitted to the controller CNTL (S12). The controller CNTL may transmit a specific command to the nonvolatile memory device NVM (S13), and the nonvolatile memory device NVM may output detection information OVSDI, corresponding to detection cases of a first page OVS operation, to the controller CNTL in response to the specific command (S14). The specific command may be, for example, a get feature command, a status read command, or the like.

The controller CNTL may determine whether read page data is error-correctable using the error correction circuit ECC (S15). When the page data read in the first page OVS operation is error-correctable, the controller CNTL may change the read levels for all states using the detection information (OVSDI) and OVST (S16).

The controller CNTL may transmit a second read command (a normal read command) to the nonvolatile memory device NVM (S17), together with the changed read level information. In one embodiment, the second read command may be different from the first read command. In another embodiment, the second read command may be the same as the first read command. The nonvolatile memory device NVM may perform a second page read operation based on the changed read levels in response to the second read command (S18). Data, read in the second page read operation, may be transmitted to the controller CNTL (S19).

Figure 18:
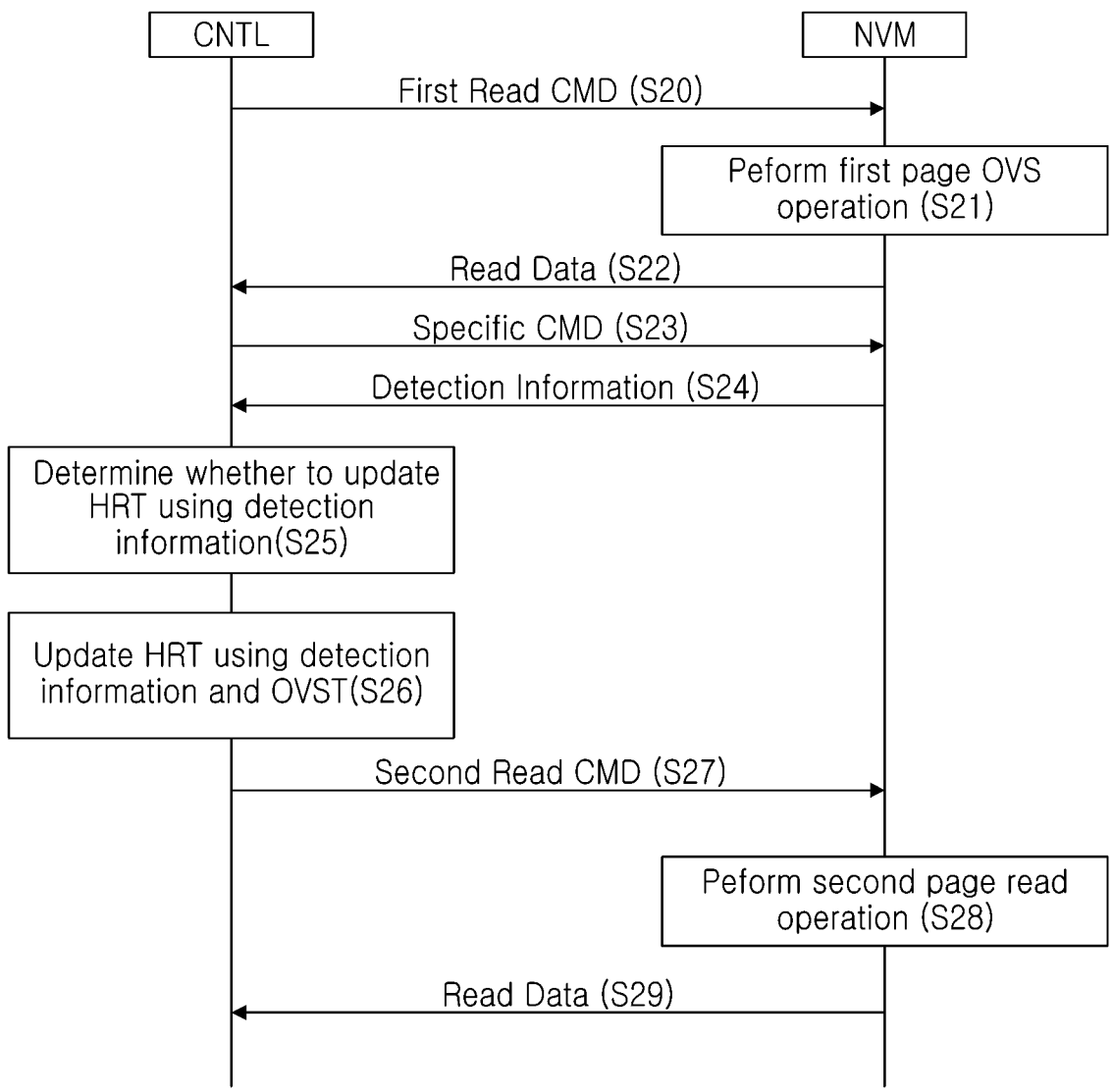
FIG. 18 is a ladder diagram illustrating an OVS recovery code process of a storage device according to another example embodiment.

FIG. 18 is a ladder diagram illustrating an OVS recovery code process of a storage device according to another example embodiment. Hereinafter, an OVS recovery code process of the storage device 10 will be described with reference to FIGS. 1 to 16 and FIG. 18.

The controller CNTL may transmit a first read command according to the OVS recovery code entry to the nonvolatile memory device NVM (S20). The nonvolatile memory device NVM may perform a first page OVS operation in response to the first read command (S21). Data, read through the first page OVS operation, may be transmitted to the controller CNTL (S22), the controller CNTL may transmit a specific command to the nonvolatile memory device (NVM) (S23), and the nonvolatile memory device NVM may output detection information (OVSDI), corresponding to a first page OVS operation, to the controller CNTL in response to the specific command (S24). The specific command may be, for example, a get feature command, a status read command, or the like.

The controller CNTL may determine whether to update a history read level table (HRT) using the detection information (OVSDI) of the first page OVS operation. The controller CNTL may determine a degradation direction and the degree of degradation of memory cells connected to a wordline using the detection information (OVSDI) for at least two read levels, and may determine whether to update the HRT for read levels required for a second page read operation according to the degradation direction and the degree of degradation (S25).

The controller CNTL may update the HRT using the detection information (OVSDI) and an OVST (S26).

The controller CNTL may transmit the second read command to the nonvolatile memory device NVM, together with the changed read level information (S27). The nonvolatile memory device NVM may perform the second page read operation based on the changed read levels in response to the second read command (S28). Data, read in the second read operation, may be transmitted to the controller CNTL (S29).

Figure 19:
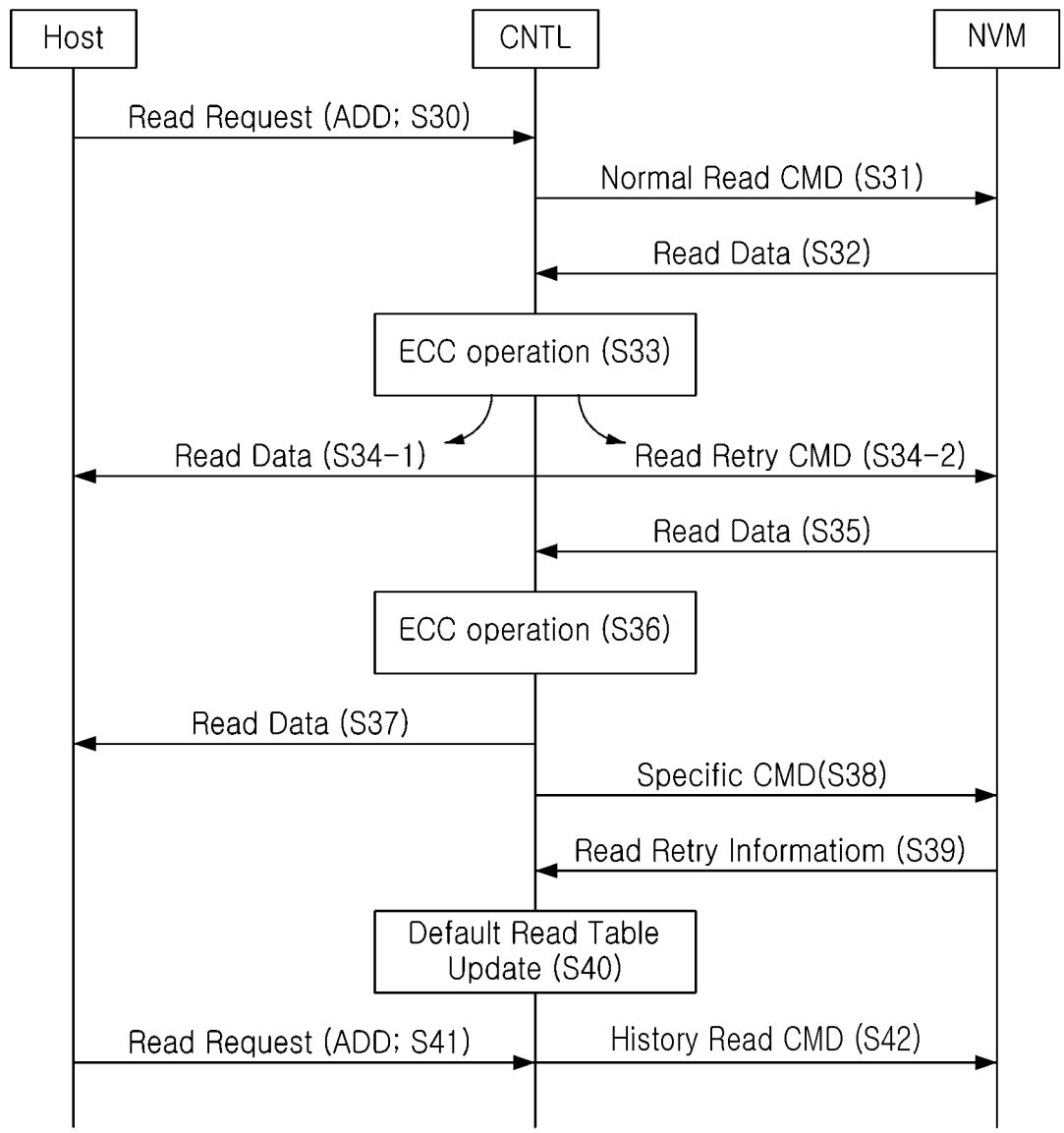
FIG. 19 is a ladder diagram illustrating a read operation of a storage device according to another example embodiment.

FIG. 19 is a ladder diagram illustrating a read operation of a storage device 10 according to another example embodiment. Hereinafter, a read operation of the storage device 10 will be described with reference to FIGS. 1 to 19.

A host may transmit a read request to the storage device 10 (see to FIG. 1), together with an address ADD (S30). A controller 200 of the storage device 10 may receive such a read request and may search the history buffer to determine whether to perform a history read operation or a normal read operation, and may transmit a normal/history read command corresponding to the determined operation to the nonvolatile memory device (NVM) 100 (see FIG. 1) (S31). The nonvolatile memory device 100 may perform a read operation in response to the normal/history read command and may transmit data, read through the read operation, to the controller 200 (S32).

The controller 200 may perform an error correction operation on the data read by the error correction circuit 230 (S33). When there is no error or an error is correctable, read data or corrected data may be transmitted to the host (S34-1).

Meanwhile, when an error is uncorrectable, the controller 200 may transmit a read retry command to the nonvolatile memory device 100 (S34-2). The nonvolatile memory device 100 may execute an OVS recovery code in response to the read retry command and may transmit the read data to the controller 200 (S35). The OVS recovery code may be executed in such a manner that at least one read level of a next page OVS operation is changed using detection information of a current page OVS operation and the next page OVS operation is performed using the changed read level, as described in FIGS. 1 to 18.

The controller 200 may re-perform an error correction operation on the data read by the error correction circuit 230 (S36). When there is no error or an error is correctable, read data or corrected data may be transmitted to the host (S37). The controller 200 may transmit a specific command to the nonvolatile memory device 100 to obtain read retry information including read level information (S38). The specific command may be, for example, a get feature command, a status read command, or the like. The nonvolatile memory device 100 may output read retry information in response to such a specific command (S39). The controller 200 may finally update an HRT using the read retry information (S40).

When a read request for the same address ADD is received from the host (S41), the storage device 100 may transmit a history read command using an optimal read level, reflected in the HRT, to the nonvolatile memory device 100 (S42).

Figure 20:
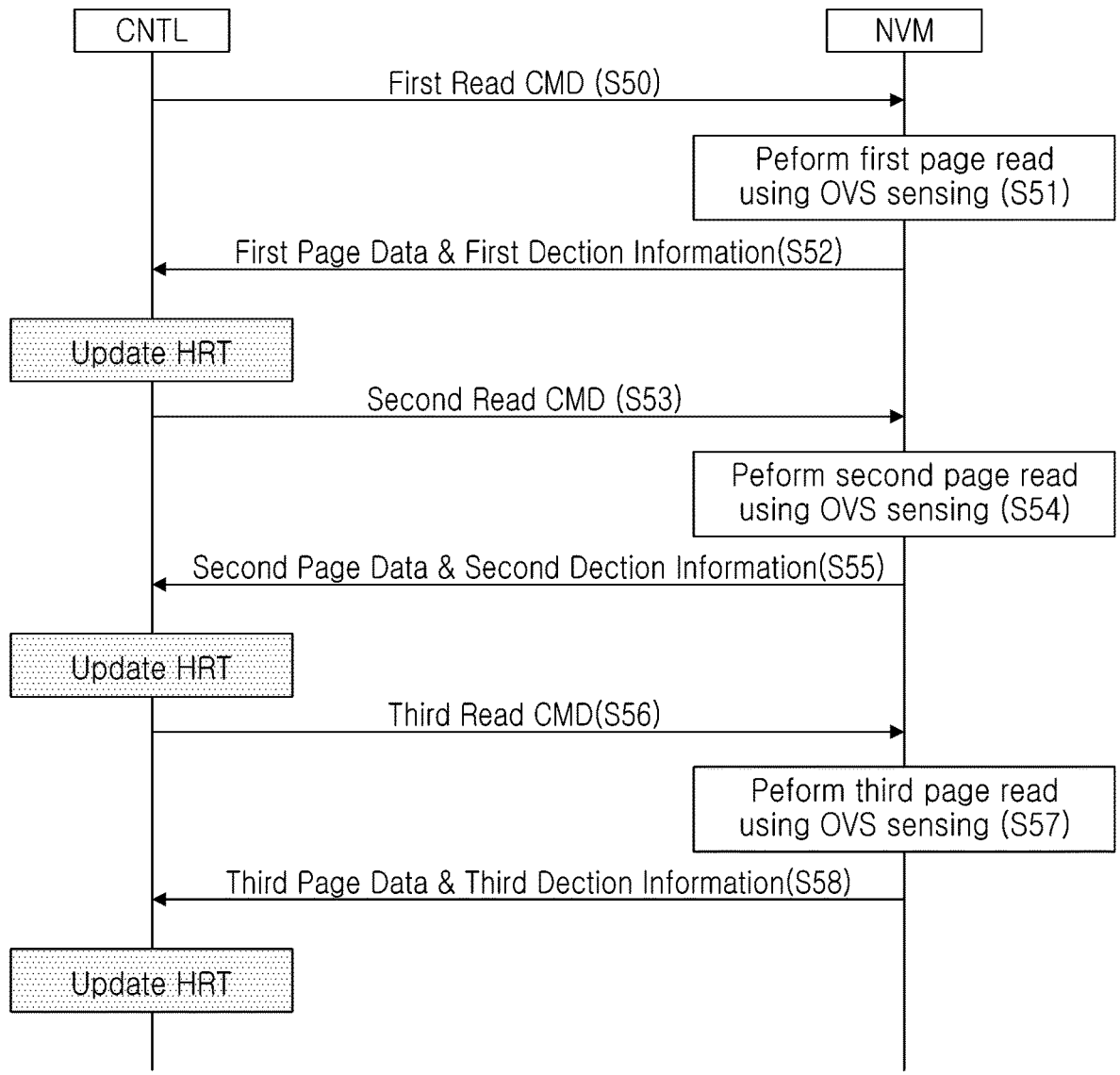
FIG. 20 is a ladder diagram illustrating a reading method of a storage device according to another example embodiment.

FIG. 20 is a ladder diagram illustrating a reading method of a storage device according to another example embodiment. Hereinafter, a read operation on a plurality of pages connected to a wordline will be described with reference to FIGS. 1 to 20.

A first OVS read command may be transmitted to the nonvolatile memory device NVM (S50). The nonvolatile memory device NVM may perform a first page read operation using OVS sensing in response to the first OVS read command (S51). As a result of the first page read operation, first page data and first detection information may be output to the controller CNTL (S52). The controller CNTL may update an HRT using the first detection information.

A second OVS read command may be transmitted to the nonvolatile memory device NVM (S53). The nonvolatile memory device NVM may perform a second page read operation using OVS sensing in response to the second OVS read command (S54). As a result of the second page read operation, second page data and second detection information may be output to the controller CNTL (S55). The controller CNTL may update the HRT using the first detection information and the second detection information.

A third OVS read command may be transmitted to the nonvolatile memory device NVM (S53). The nonvolatile memory device NVM may perform a third page read operation using OVS sensing in response to the third OVS read command (S57). As a result of the third page read operation, third page data and third detection information may be output to the controller CNTL (S58). The controller CNTL may update the HRT using the first detection information, the second detection information, and the third detection information.

In FIGS. 7A to 20, a memory cell has been described as being a triple level cell (TLC). However, a memory cell of the present disclosure does not need to be limited thereto and may be a quadruple level cell (QLC).

Figure 21:
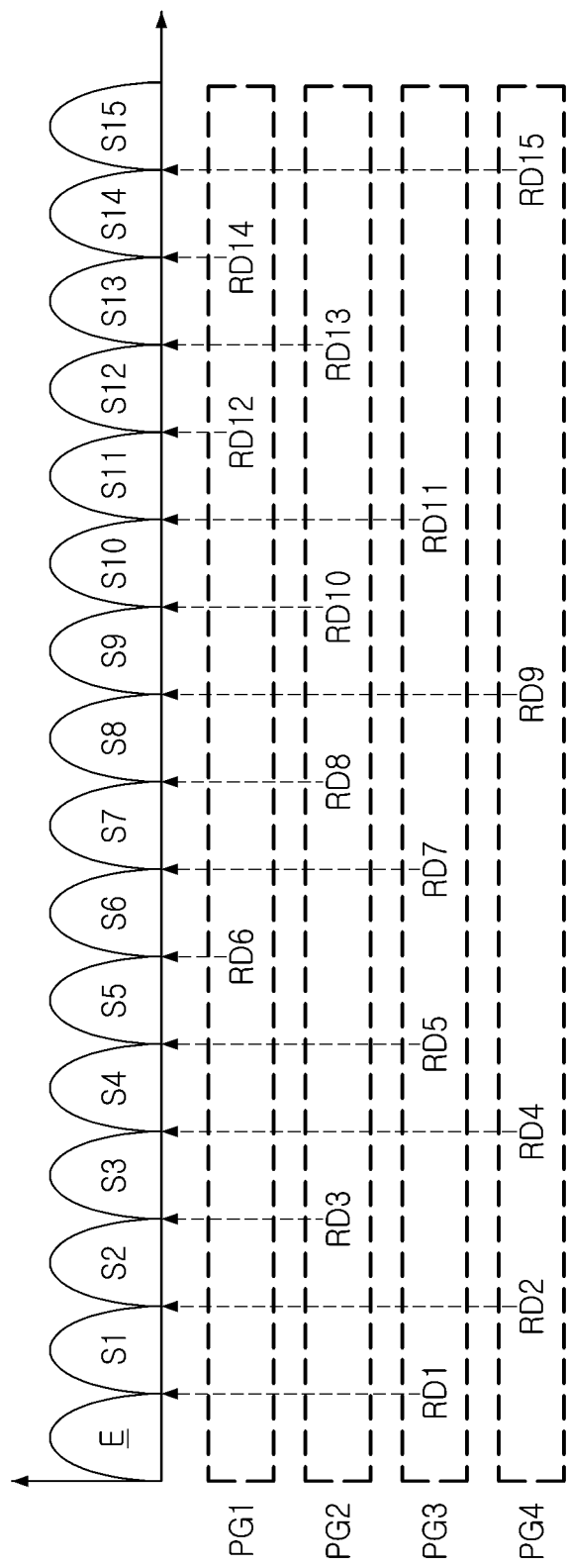
FIG. 21 is a view illustrating an example of page reading of a QLC according to an example embodiment.

FIG. 21 is a view illustrating an example of page reading of a QLC according to an example embodiment. In FIG. 21, sixteen states E and S1 to S15 and four pages PG1, PG2, PG3, and PG4 are illustrated.

The first page PG1 may include a first bit according to read operations of the sixth read level RD6, the twelfth read level RD12, and the fourteenth read level RD14.

The second page PG2 may include a second bit according to read operations of the third read level RD3, the eighth read level RD8, the tenth read level RD10, and the thirteenth read level RD13.

The third page PG3 may include a third bit according to read operations of the first read level RD1, the fifth read level R5, the seventh read level RD7, and the eleventh read level RD11.

The fourth page PG4 may include a fourth bit according to read operations of the second read level RD2, the fourth read level RD4, the ninth read level RD9, and the fifteenth read level RD15.

It will be understood that 4-bit data encoding does not limit the present disclosure.

A storage device according to an example embodiment may include an artificial intelligence (AI) processor for specific purpose of a recovery code.

Figure 22:
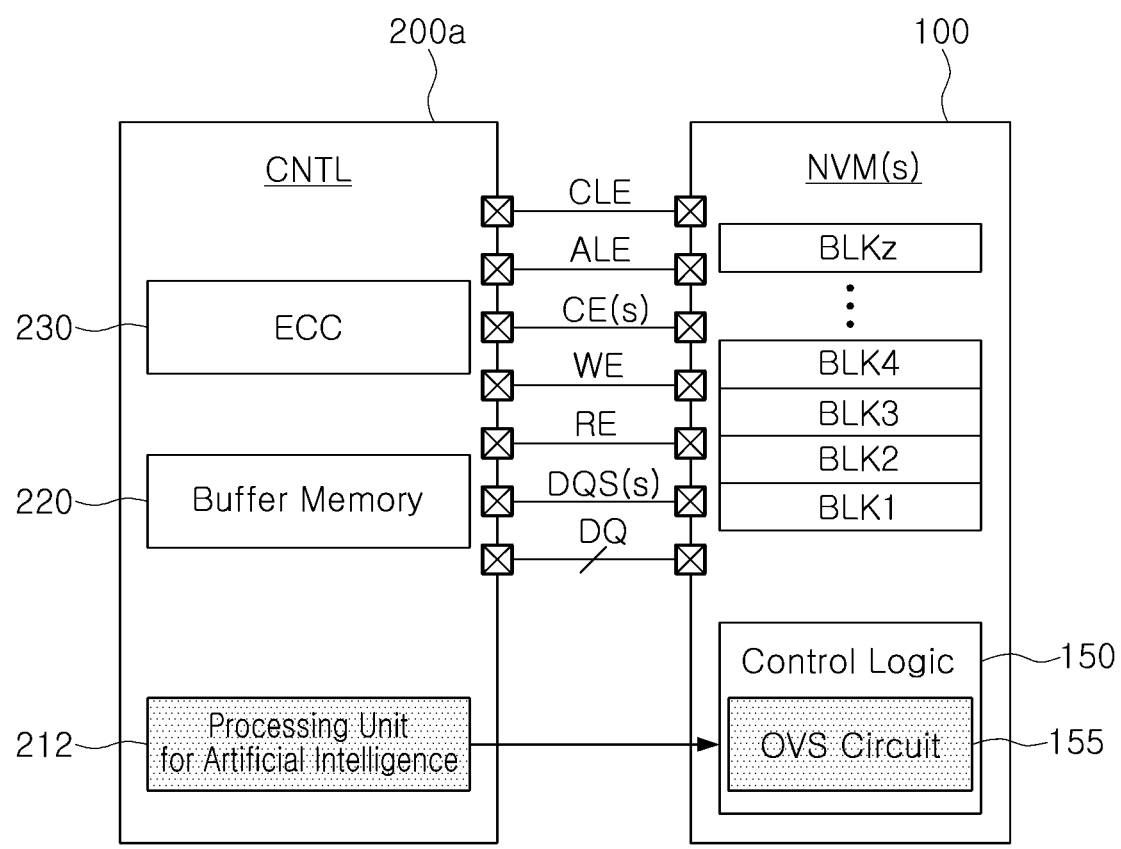
FIG. 22 is a view illustrating a storage device according to another example embodiment.

FIG. 22 is a view illustrating a storage device 20 according to another example embodiment.

Referring to FIG. 22, the storage device 20 may include an artificial intelligence (AI) processor 212 controlling an OVS recovery code, as compared with the storage code 10 illustrated in FIG. 1. The AI processor 212 may perform machine learning to manage reliability of a nonvolatile memory device 100.

A nonvolatile memory device according to an example embodiment may be implemented in a chip-to-chip (C2C) structure.

Figure 23:
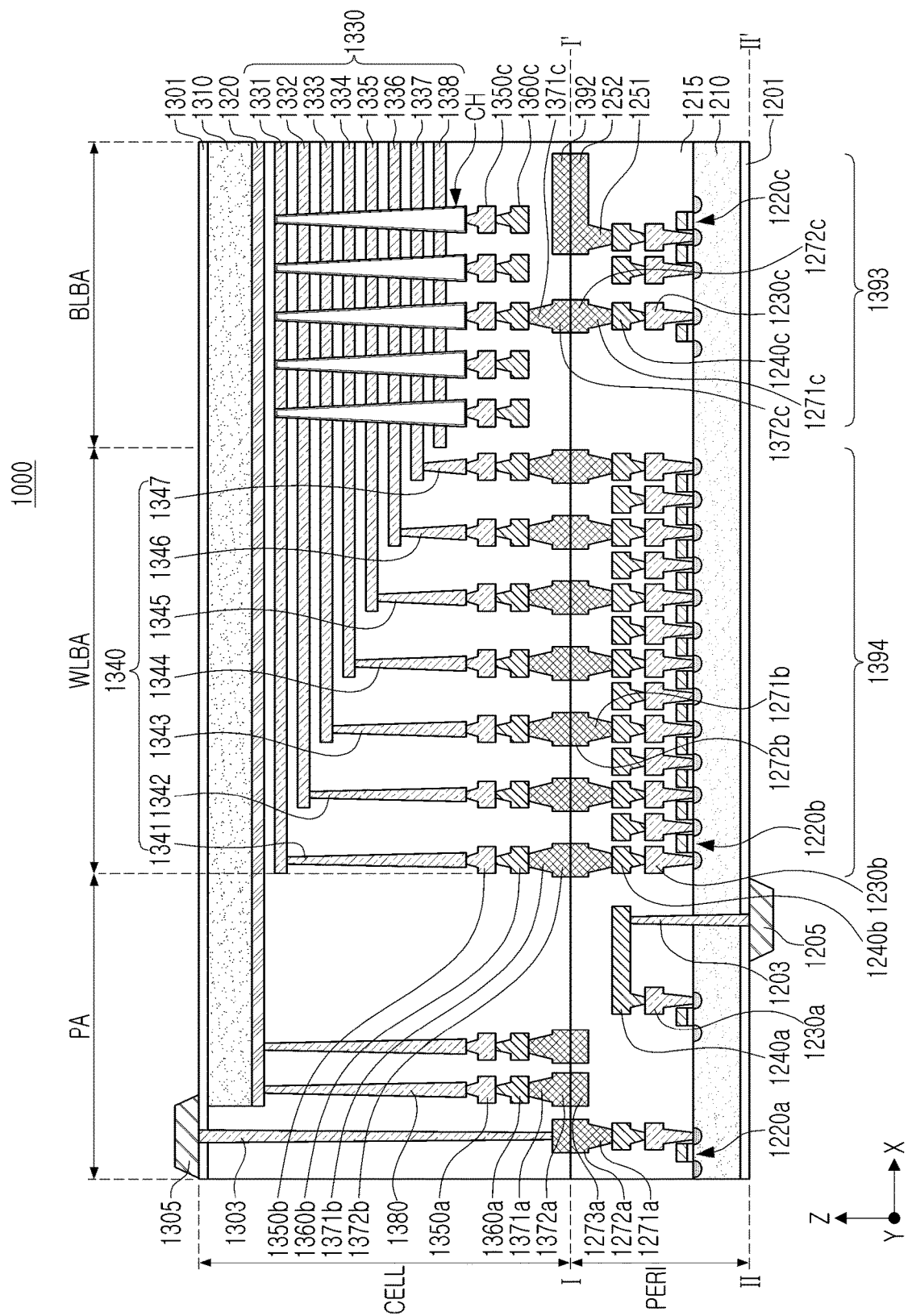
FIG. 23 is a view illustrating a nonvolatile memory device implemented in a C2C structure according to an example embodiment.

FIG. 23 is a view illustrating a nonvolatile memory device 1000 implemented in a C2C structure according to an example embodiment. The C2C structure means that an upper chip including a cell region CELL is manufactured on a first wafer and a lower chip including a peripheral circuit region PERI is manufactured on a second wafer different from the first wafer, and then the upper chip and the lower chip are connected to each other in a bonding manner. For example, the bonding manner may be a manner in which a bonding metal formed on an uppermost metal layer of the upper chip and a bonding metal formed on an uppermost metal layer of the lower chip are electrically connected to each other. In one embodiment, when the bonding metal is formed of copper (Cu), the bonding manner may be a Cu-to-Cu bonding manner. In another embodiment, the bonding manner may be formed of aluminum (Al) or tungsten (W).

Each of the peripheral circuit region PERI and the cell region CELL of the nonvolatile memory device 1000 may include an external pad bonding area PA, a wordline bonding area WLBA, and a bitline bonding area BLBA.

The peripheral circuit region PERI may include a first substrate 1210, an interlayer insulating layer 1215, a plurality of circuit elements 1220a, 1220b, and 1220c formed on the first substrate 1210, and first metal layers 1230a, 1230b, and 1230c, respectively connected to the plurality of circuit elements 1220a, 1220b, and 1220c, and the second metal layers 1240a, 1240b, and 1240c formed on the first metal layers 1230a, 1230b, and 1230c. In an example embodiment, the first metal layers 1230a, 1230b, and 1230c may be formed of tungsten (W) having relatively high resistivity. In an example embodiment, the second metal layers 1240a, 1240b, and 1240c may be formed of copper (Cu) having relatively low resistivity.

In FIG. 23, the first metal layer 1230a, 1230b, and 1230c and the second metal layer 1240a, 1240b, and 1240c are illustrated, but the present disclosure is not be limited thereto. One or more metal layers may be further formed on the second metal layers 1240a, 1240b, and 1240c. At least some of the one or more metal layers, formed on the second metal layers 1240a, 1240b, and 1240c, may be formed of aluminum (Al) having resistivity different from copper (Cu) forming the second metal layers 1240a, 1240b, and 1240c.

In an example embodiment, an interlayer insulating layer 1215 may be formed on the first substrate 1210 to cover the plurality of circuit elements 1220a, 1220b, and 1220c, the first metal layers 1230a, 1230b, and 1230c, and the second metal layers 1240a, 1240b, and 1240c. In an example embodiment, the interlayer insulating layer 1215 may include or may be formed of an insulating material such as a silicon oxide or a silicon nitride.

Lower bonding metals 1271b and 1272b may be formed on the second metal layer 1240b of the wordline bonding area WLBA. In the wordline bonding area WLBA, the lower bonding metals 1271b and 1272b of the peripheral circuit region PERI may be electrically connected to the upper bonding metals 1371b and 1372b of the cell region CELL in a bonding manner. In an example embodiment, the lower bonding metals 1271b and 1272b and the upper bonding metals 1371b and 1372b may be formed of aluminum (Al), copper (Cu), or tungsten (W). In addition, the upper bonding metals 1371b and 1372b of the cell region CELL may be referred to as first metal pads, and the lower bonding metals 1271b and 1272b may be referred to as second metal pads.

The cell region CELL may include at least one memory block. In an example embodiment, the cell region CELL may include a second substrate 1310 and a common source line 1320. A plurality of wordlines 1330 (1331 to 1338) may be stacked on the second substrate 1310 in a direction perpendicular to an upper surface of the second substrate 1310 (a Z-axis direction). String select lines and ground select lines may be disposed above and below the wordlines 1330, respectively. In an example embodiment, a plurality of wordlines 1330 may be disposed between the string select lines and the ground select line.

In the bitline bonding area BLBA, the channel structure CH may extend in the direction perpendicular to the upper surface of the second substrate 1310 (the Z-axis direction) to penetrate through the wordlines 1330, the string select lines, and the ground select lines. The channel structure CH may include a data storage layer, a channel layer, and a buried insulating layer, and the like, and the channel layer may be electrically connected to the first metal layer 1350c and the second metal layer 1360c. For example, the first metal layer 1350c may be a bitline contact, and the second metal layer 1360c may be a bitline. In an example embodiment, the bitline 1360c may extend in a first direction (a Y-axis direction) parallel to the upper surface of the second substrate 1310.

An area, in which the channel structure CH and the bitline 1360c are disposed, may be defined as the bitline bonding area BLBA, as is illustrated in FIG. 23. In an example embodiment, in the bitline bonding area BLBA. The bitline 1360c may be electrically connected to the circuit elements 1220c providing a page buffer 1393 in the peripheral circuit region PERI. For example, the bitline 1360c may be connected to the upper bonding metals 1371c and 1372c in the peripheral circuit region PERI. The upper bonding metals 1371c and 1372c may be connected to the lower bonding metals 1271c and 1272c connected to the circuit elements 1220c of the page buffer 1393. In the wordline bonding area WLBA, the wordlines 1330 may extend in a second direction (an X-axis direction), perpendicular to the first direction and parallel to an upper surface of the second substrate 1310. In an example embodiment, the wordline bonding area WLBA may be connected to the plurality of cell contact plugs 1340 (1341 to 1347). For example, the wordlines 1330 and the cell contact plugs 1340 may be connected to each other on pads provided by extending at least one of the wordlines 1330 by different lengths in the second direction. In an example embodiment, the first metal layer 1350b and the second metal layer 1360b may be sequentially connected to cell contact plugs 1340 connected to the wordlines 1330. In an example embodiment, in the wordline bonding area WLBA, the cell contact plugs 1340 may be connected to the peripheral circuit region PERI through the upper bonding metals 1371b and 1372b of the cell region CELL and the lower bonding metals 1271b and 1272b of the peripheral circuit region PERI.

In an example embodiment, the cell contact plugs 1340 may be electrically connected to the circuit elements 1220b providing a row decoder 1394 in the peripheral circuit region PERI. In an example embodiment, an operating voltage of the circuit elements 1220b, providing the row decoder 1394, may be different from an operating voltage of the circuit elements 1220c providing the page buffer 1393. For example, the operating voltage of the circuit elements 1220c, providing the page buffer 1393, may be higher than the operating voltage of the circuit elements 1220b providing the row decoder 1394.

A common source line contact plug 1380 may be disposed in the external pad bonding area PA. In an example embodiment, the common source line contact plug 1380 may be formed of a conductive material such as a metal, a metal compound, or polysilicon. The common source line contact plug 1380 may be electrically connected to the common source line 1320. A first metal layer 1350a and a second metal layer 1360a may be sequentially stacked on the common source line contact plug 1380. For example, an area, in which the common source line contact plug 1380, the first metal layer 1350a, and the second metal layer 1360a are disposed, may be defined as an external pad bonding area PA. The second metal layer 1360a may be electrically connected to an upper metal via 1371a. The upper metal via 1371a may be electrically connected to an upper metal pattern 1372a.

Input/output pads 1205 and 1305 may be disposed in the external pad bonding area PA. Referring to FIG. 23, a lower insulating layer 1201 may be formed below the first substrate 1210. A first input/output pad 1205 may be formed on the lower insulating layer 1201. In an example embodiment, the first input/output pad 1205 may be connected to at least one of the plurality of circuit elements 1220a, 1220b, and 1220c disposed in the peripheral circuit region PERI through the first input/output contact plug 1203. In an example embodiment, the first input/output pad 1205 may be separated from the first substrate 1210 by the lower insulating layer 1201. In addition, a side insulating layer may be disposed between the first input/output contact plug 1203 and the first substrate 1210 to electrically separate the first input/output contact plug 1203 and the first substrate 1210 from each other.

Referring to FIG. 23, an upper insulating layer 1301 may be formed on the second substrate 1310 to cover an upper surface of the second substrate 1310. A second input/output pad 1305 may be disposed on the upper insulating layer 1301. In an example embodiment, the second input/output pad 1305 may be connected to at least one of the plurality of circuit elements 1220a, 1220b, and 1220c disposed in the peripheral circuit region PERI through a second input/output contact plug 1303, a lower metal pattern 1272a, and a lower metal via 1271a.

In an example embodiment, the second substrate 1310, the common source line 1320, and the like, may not be disposed in a region in which the second input/output contact plug 1303 is disposed. The second input/output pad 1305 may not overlap the wordlines 1380 in the third direction (the Z-axis direction). Referring to FIG. 23, the second input/output contact plug 1303 may be separated from the second substrate 1310 in a direction parallel to the upper surface of the second substrate 1310. The second input/output contact plug 1303 may penetrate through the interlayer insulating layer 1315 of the cell region CELL to be connected to the second input/output pad 1305. In an example embodiment, the second input/output pad 1305 may be electrically connected to the circuit element 1220a.

In an example embodiment, the first input/output pad 1205 and the second input/output pad 1305 may be selectively formed. For example, the nonvolatile memory device 1000 may include only the first input/output pad 1205 disposed on the first substrate 1201 or only the second input/output pad 1305 disposed on the second substrate 1301. In another embodiment, the nonvolatile memory device 1000 may include both the first input/output pad 1205 and the second input/output pad 1305.

A metal pattern of an uppermost metal layer may be present as a dummy pattern in the external pad bonding area PA and the bitline bonding area BLBA, respectively included in the cell region CELL and the peripheral circuit region PERI, or the uppermost metal layer may be absent.

The nonvolatile memory device 1000 according to an example embodiment may include a lower metal pattern 1273a. In the external pad bonding area PA, the lower metal pattern 1273a may be formed on an uppermost metal layer of the peripheral circuit region PERI to have the same shape as an upper metal pattern 1372a of the cell region CELL to correspond to an upper metal pattern 1372a formed on an uppermost metal layer of the cell region CELL. The lower metal pattern 1273a, formed on the uppermost metal layer of the peripheral circuit region PERI, may not be connected to an additional contact in the peripheral circuit region PERI. Similarly, in the external pad bonding area PA, an upper metal pattern may be formed on an upper metal layer of the cell region CELL to have the same shape as a lower metal pattern of the peripheral circuit region PERI to correspond to a lower metal pattern formed on an uppermost metal layer of the peripheral circuit region PERI.

Figure 24:
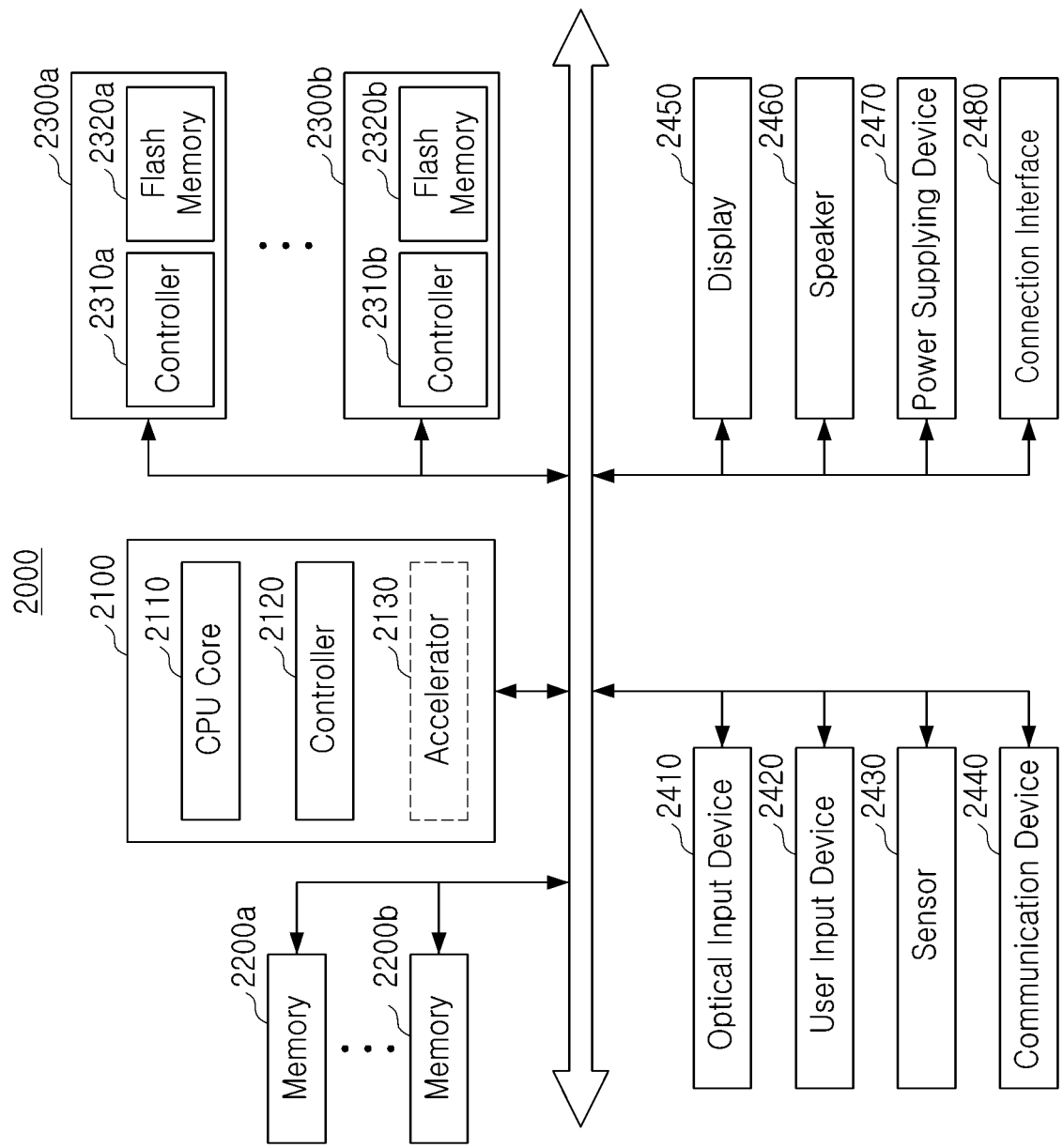
FIG. 24 is a view illustrating an electronic device to which a storage device according to an example embodiment is applied.

FIG. 24 is a view illustrating an electronic device 2000 to which a storage device according to an example embodiment is applied. The electronic device 2000 of FIG. 24 may be a mobile system such as a portable communications terminal (a mobile phone), a smartphone, a tablet personal computer (PC), a wearable device, a healthcare device, or an Internet of Things (IoT) device. However, the electronic device 2000 of FIG. 24 is not limited to such a mobile system, and may be a personal computer, a laptop computer, a server, a media player, an automotive device such as a navigation system, or the like.

Referring to FIG. 24, the electronic device 2000 may include a main processor 2100, memories 2200a and 2200b, and storage devices 2300a and 2300b. The electronic device 2000 may further include at least one of an image capturing device 2410, a user input device 2420, a sensor 2430, a communications device 2440, a display 2450, a speaker 2460, a power supplying device 2470, and a connection interface 2480.

The main processor 2100 may control all operations of the electronic device 2000, in further detail, operations of other components constituting the electronic device 2000. The main processor 2100 may be implemented as a general-purpose processor, a specific-purpose processor, or an application processor.

The main processor 2100 may include one or more CPU cores 2110, and may further include a controller 2120 to control the memories 2200a and 2200b and/or the storage devices 2300a and 2300b. According to example embodiments, the main processor 2100 may further include an accelerator block 2130, a specific-purpose circuit for a high-speed data operation such as an artificial intelligence (AI) data operation. Such an accelerator block 2130 may include a graphics processing unit (GPU), a neural processing unit (NPU), and/or a data processing unit (DPU), and may be implemented as a chip physically independent of other components of the main processor 2100.

The memories 2200a and 2200b may be used as a main memory device of the system 2000. The memories 2200a and 2200b may include a volatile memory such as an SRAM and/or a DRAM, but may also include a nonvolatile memory such as a flash memory, a PRAM, and/or an RRAM. The memories 2200a and 2200b may be implemented in the same package as the main processor 2100.

The storage devices 2300a and 2300b may function as nonvolatile storage devices storing data, irrespective of whether power supplies thereof are interrupted, and may have higher storage capacity than the memories 2200a and 2200b. The storage devices 2300a and 2300b may include storage controllers 2310a and 2310b and nonvolatile memory (NVM) storages 2320a and 2320b storing data under the control of the storage controllers 2310a and 2310b. The nonvolatile memories 2320a and 2320b may include a two-dimensional (2D) structure or a three-dimensional (3D) V-NAND flash memory, but may include other types of nonvolatile memory such as a PRAM and/or an RRAM.

The storage devices 2300a and 2300b may be included in the electronic device 2000 while being physically separated from the main processor 2100, or may be implemented in the same package as the main processor 2100. In addition, the storage devices 2300a and 2300b may have the same shape as a solid state device (SSD) or a memory card to be removably coupled to other components of the electronic device 2000 through an interface such as an interface 2480 to be described later. The storage devices 2300a and 2300b may be devices, to which the standard protocols are applied, such as a universal flash storage (UFS), an embedded multi-media card (eMMC), or nonvolatile memory express (NVMe), but are not limited thereto.

The image capturing device 2410 may capture still images or moving images (videos), and may be a camera, a camcorder, and/or a webcam.

The user input device 2420 may receive various types of data input from a user of the electronic device 2000, and may include a touchpad, a keypad, a keyboard, a mouse, and/or a microphone.

The sensor 2430 may sense various types of physical quantity which may be obtained from an external entity of the electronic device 2000, and may convert the sensed various types of physical quantity into electrical signals. The sensor 2430 may be a temperature sensor, a pressure sensor, an illuminance sensor, a position sensor, an acceleration sensor, a biosensor, and/or a gyroscope.

The communications device 2440 may transmit and receive signals to and from other devices outside the electronic device 2000 according to various communication protocols. The communications device 2440 may include an antenna, a transceiver, and/or a modem.

The display 2450 and the speaker 2460 may function as output devices, respectively outputting visual information and audio information to a user of the electronic device 2000.

The power supplying device 2470 may appropriately convert power, supplied from a battery embedded in the electronic device 2000 and/or an external power supply, and may supply the converted power to each the component of the electronic device 2000.

The connection interface 2480 may provide a connection between the electronic device 2000 and an external device connected to the electronic device 2000 to exchange data with the electronic device 2000. The connection interface 2480 may be implemented in various interface manners such as Advanced Technology Attachment (ATA), Serial ATA (SATA), external SATA (e-SATA), Small Computer Small Interface (SCSI), Serial Attached SCSI (SAS), Peripheral Component Interconnection (PCI), PCI express (PCIe), NVMe (NVM express), IEEE 1394, universal serial bus (USB), secure digital (SD) card, multi-media card (MMC), embedded multi-media card (eMMC), universal flash Storage (UFS), embedded universal flash storage (eUFS), compact flash (CF) card interface, and the like.

In general, optimal valleys of the same page may be degraded in similar directions. For this reason, an OVS recovery code according to an example embodiment does not search an OVS Table to update a history read level table (HRT) whenever an error has occurred in each state, but may also be reflected in advance in valley correction of another state in the same page in a direction searched in a first read command to reduce probability of error occurrence.

In an OVS recovery code according to an example embodiment, a history read level table (HRT) may be updated after an OVS operation. For example, as illustrated in the embodiment of FIGS. 10A-10D, only when OVS detection results of R7 and R3 are the same, all state offset information of an OVS may be updated in all state offsets of the history read level table (HRT).

In the OVS recovery code according to an example embodiment, when the OVS detection results of R7 and R3 are different from each other, only self-state offset information of the OVS may be updated in the history read level table (HRT), as in the method according to the related art.

In the OVS recovery code according to an example embodiment, when the OVS detection results of R7 and R3 are different from each other but move in the same direction, all state offset information of the OVS may be updated in all state offsets of the history RF table. However, all state offset information may be updated to a value of a less degraded case to prevent overcompensation.

Thus, the OVS recovery code according to the present disclosure may improve error correction ability, reduce latency, and reduce a retry entry rate.

The OVS recovery code according to an example embodiment may determine whether to update a history read level table (HRT) according to a result of the first RD detection when the history read level table (HRT) is updated after an OVS operation.

As described above, in a nonvolatile memory device according to an example embodiment, a controller for controlling the same, a storage device including the same, and a reading method of the same, second page read operation degradation information may be reflected in an offset using detection information of a first page OVS operation, and a second page read operation may be performed using an offset reflected in advance. Thus, error uncorrectable probability may be reduced, and reliability may be improved accordingly.

In a nonvolatile memory device according to an example embodiment, a controller for controlling the same, a storage device including the same, and a reading method of the same, a second page read operation may be performed using detection information of a first OVS operation, so that lifetime recovery code entry may be reduced to expect improvement of systemic performance.

While example embodiments have been shown and described above, it will be apparent to those skilled in the art that modifications and variations could be made without departing from the scope of the present inventive concept as defined by the appended claims.

What is claimed is:

1. A reading method of a nonvolatile memory device, the reading method comprising:
   receiving, from a controller, a first read command for reading first page data, corresponding to a wordline;
   performing a first page on-chip valley search (OVS) operation in response to the first read command;
   outputting the first page data based on the first page OVS operation to the controller;
   outputting detection information, indicating detection cases for at least two states of the first page OVS operation, to the controller in response to a command from the controller;

receiving, from the controller, a second read command for reading second page data, corresponding to the wordline;

performing a second page read operation in response to the second read command; and outputting the second page data, based on the second page read operation, to the controller, wherein a read level of at least one state, different from the at least two states, is changed to a changed read level using the detection information, and the second page read operation is performed based on the changed read level.

2. The reading method of claim 1, wherein the first page OVS operation includes an OVS sensing operation using a plurality of development times for searching a distribution valley corresponding to one state and a main sensing operation using a detection case corresponding to the distribution valley searched in the OVS sensing operation.

3. The reading method of claim 1, wherein the first read command and the second read command are different from each other, the wordline is connected to a plurality of memory cells, and each of the plurality of memory cells is a 3-bit memory cell.

4. The reading method of claim 3, wherein the first page OVS operation is a read operation for reading a most significant bit (MSB) page, and the second page read operation is a read operation for reading the MSB page, a central significant bit (CSB) page, or a least significant bit (LSB) page.

5. The reading method of claim 4, wherein the first page OVS operation includes a first OVS read operation based on a first read level R3 and a second OVS read operation based on a second read level R7.

6. The reading method of claim 3, wherein the first page OVS operation includes a first OVS read operation for determining a first state and a second OVS read operation for determining a second state, a degradation direction is determined according to a first detection case of the first OVS read operation and a second detection case of a second OVS read operation, and a determination is made as to whether to change a read level for determining at least one of the other states, according to the determined degradation direction and the degree of determination.

7. The reading method of claim 6, wherein when the first detection case of the first OVS read operation and the second detection case of the second OVS read operation are the same, a read level for determining a third state of the second OVS read operation is changed into a value, corresponding to the same detection case, using an OVS table.

8. The reading method of claim 6, wherein when the first detection case of the first OVS read operation and the second detection case of the second OVS read operation are not the same and the first detection case and the second detection case indicate the same degradation direction, a read level for reading a third state of the second OVS read operation is changed according to a less degraded detection case of the first detection case and the second detection case.

9. The reading method of claim 6, wherein when the first detection case of the first OVS read operation and the second detection case of the second OVS read operation are not the same and the first detection case and the second detection case indicate different degradation directions, a read level for determining a third state of the second OVS read operation is not changed.

10. The reading method of claim 1, further comprising:

receiving a third read command from the controller when the second page data is error uncorrectable data; and performing a read retry operation using a predetermined table in response to the third read command.

11. A nonvolatile memory device comprising:

a plurality of memory blocks, each memory block including at least two strings between respective bitlines and a common source line, wherein each of the at least two strings includes at least one string select transistor, a plurality of memory cells, and at least one ground transistor connected between one of the bitlines and the common source line in series, the at least one string select transistor has a gate connected to a string select line, each of the plurality of memory cells is provided with a wordline voltage from a corresponding wordline, and the at least one ground transistor has a gate connected to a ground select line; and a control logic circuit configured to perform a first page on-chip valley search (OVS) operation on a first subset of the plurality of memory cells connected to one of the plurality of memory blocks in response to an address during a read operation, to change a read level of at least one state to a changed read level using detection information of the first page OVS operation during the read operation, and to perform a second page read operation on a second subset of the plurality of memory cells using the changed read level in response to a second read command during the read operation.

12. The nonvolatile memory device of claim 11, wherein the first page OVS operation includes a first OVS read operation on a first state and a second OVS read operation on a second state, and the detection information includes information, indicating a first detection case of the first OVS read operation, and information indicating a second detection case of the second OVS read operation, and a read level of the second page read operation is changed according to the first detection case and the second detection case.

13. The nonvolatile memory device of claim 12, wherein each of the first and second detection cases indicates five or seven offset levels based on a corresponding read level.

14. The nonvolatile memory device of claim 12, wherein the control logic circuit further includes an OVS circuit configured to perform the first page OVS operation, and the OVS circuit changes read levels for the other states, other than the first and second states, when the detection information of the first page OVS operation indicates the same degradation direction.

15. The nonvolatile memory device of claim 14, wherein the OVS circuit changes read levels for the first state and the second state when the detection information of the first page OVS operation indicates different degradation directions.

16. A controller comprising:

control pins configured to provide control signals to at least one nonvolatile memory device;

a buffer memory configured to store a first table, a second table, and a third table;

an error correction circuit configured to correct an error in first page data read from the at least one nonvolatile memory device according to a first read command, or to correct an error in second page data read from the at least one nonvolatile memory device according to a second read command; and a processor configured to drive a read level compensation unit configured to manage a read level of a read operation of the at least one nonvolatile memory device, wherein the first table includes a first read level offset predetermined based on environmental information, the second table includes a second read level offset according to a state-dependent detection case in an on-chip valley search (OVS) operation, the third table includes a third read level offset generated using the first read level offset or the second read level offset, and the read level compensation unit updates the third read level offset which corresponds to a read level to be used in a second page read operation according to the second read command using detection information of a first page OVS operation according to the first read command and the second table.

17. The controller of claim 16, wherein
the detection information of the first page OVS operation is received from the at least one nonvolatile memory device.

18. The controller of claim 16, wherein the detection information includes information indicating detection cases for at least two states, and
the read level compensation unit determines a degradation direction or a degree of degradation using the detection information.

19. The controller of claim 18, wherein when degradation directions of the detection cases are the same, the read level compensation unit updates read level offsets of the third table for all states using the first table and the second table.

20. The controller of claim 18, wherein when degradation directions of the detection cases are not the same, the read level compensation unit updates read level offsets of the third table for the at least two states using the first table or the second table.

* * * * *